United States Patent
Leung et al.

(10) Patent No.: US 11,283,409 B2
(45) Date of Patent: Mar. 22, 2022

(54) SIGNAL COMBINER

(71) Applicant: QUALCOMM Incorporated, San Diego, CA (US)

(72) Inventors: Lai Kan Leung, San Marcos, CA (US); Xinmin Yu, San Diego, CA (US); Chirag Dipak Patel, San Diego, CA (US); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 59 days.

(21) Appl. No.: 16/557,961

(22) Filed: Aug. 30, 2019

(65) Prior Publication Data

US 2021/0067099 A1    Mar. 4, 2021

(51) Int. Cl.
*H03F 1/02* (2006.01)
*H01P 1/213* (2006.01)
*H03F 3/60* (2006.01)

(52) U.S. Cl.
CPC ......... *H03F 1/0288* (2013.01); *H01P 1/2133* (2013.01); *H03F 3/602* (2013.01)

(58) Field of Classification Search
CPC ...... H01P 1/2133; H03H 1/0288; H03F 3/602
USPC .................................................... 333/124 R
See application file for complete search history.

(56) References Cited

U.S. PATENT DOCUMENTS

| | | | | |
|---|---|---|---|---|
| 4,521,737 A | * | 6/1985 | Bynum | ...................... H03F 3/72 330/277 |
| 4,525,678 A | * | 6/1985 | Lehmann | ................ H03F 3/193 330/277 |
| 7,030,714 B2 | | 4/2006 | Korol et al. | |
| 7,696,841 B2 | | 4/2010 | Chen et al. | |
| 7,812,775 B2 | | 10/2010 | Babakhani et al. | |
| 7,907,921 B2 | | 3/2011 | Pan et al. | |
| 8,044,716 B1 | | 10/2011 | Loeb et al. | |

(Continued)

FOREIGN PATENT DOCUMENTS

WO    2019050632    3/2019

OTHER PUBLICATIONS

Lin S., et al., "A 60-GHz Digitally Controlled RF Beamforming Array in 65-nm CMOS with Off-Chip Antennas", IEEE, 2011 IEEE Radio Frequency Integrated Circuits Symposium, Jun. 2011, 4 pages.

(Continued)

*Primary Examiner* — Robert J Pascal
*Assistant Examiner* — Kimberly E Glenn
(74) *Attorney, Agent, or Firm* — Qualcomm Incorporated

(57) ABSTRACT

In certain aspects, a receiver includes first amplifiers, wherein each one of the first amplifiers comprises an input and an output. The receiver also includes second amplifiers, wherein each one of the second amplifiers comprises an input and an output, and the outputs of the second amplifiers are coupled to a combining node. The receiver also includes transmission lines, wherein each one of the transmission lines is coupled between the output of a respective one of the first amplifiers and the input of a respective one of the second amplifiers. The receiver further includes a load coupled to the combining node, and receiver elements, wherein each one of the receiver elements comprises an input and an output, and the output of each one of the receiver elements is coupled to the input of a respective one of the first amplifiers.

49 Claims, 22 Drawing Sheets

(56) References Cited

U.S. PATENT DOCUMENTS

| | | | |
|---|---|---|---|
| 9,059,665 | B2 | 6/2015 | Youssef et al. |
| 9,106,185 | B2 | 8/2015 | Youssef et al. |
| 9,154,356 | B2 | 10/2015 | Tasic et al. |
| 9,154,357 | B2 | 10/2015 | Tasic et al. |
| 9,160,598 | B2 | 10/2015 | Davierwalla et al. |
| 9,285,461 | B2 | 3/2016 | Swirhun et al. |
| 9,667,206 | B2 | 5/2017 | Anderson et al. |
| 9,929,701 | B1 | 3/2018 | Noori et al. |
| 2011/0063048 | A1 | 3/2011 | Floyd et al. |
| 2018/0241122 | A1* | 8/2018 | Jalali Mazlouman ... H01Q 3/36 |
| 2019/0115880 | A1 | 4/2019 | Kim et al. |

OTHER PUBLICATIONS

Yu T., "High performance 24 GHz CMOS Phased Array Receivers with On-Chip Coupling Characterization", California Digital Library, University of California, 2009, 152 pages.

International Search Report and Written Opinion—PCT/US2020/048339—ISA/EPO—dated Dec. 10, 2020.

* cited by examiner

SIGNAL COMBINER

BACKGROUND

Field

Aspects of the present disclosure relate generally to wireless communications, and more particularly, to signal combiners for use in phased-array receivers.

Background

Phased antenna arrays are used in wireless communication systems (e.g., fifth generation (5G) communication systems) operating in the millimeter wave (mmWave) band (e.g., tens of gigahertz). A phased antenna array allows a wireless device to transmit and/or receive signals with high directivity for increased range.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a receiver. The receiver includes first amplifiers, wherein each one of the first amplifiers comprises an input and an output. The receiver also includes second amplifiers, wherein each one of the second amplifiers comprises an input and an output, and the outputs of the second amplifiers are coupled to a combining node. The receiver also includes transmission lines, wherein each one of the transmission lines is coupled between the output of a respective one of the first amplifiers and the input of a respective one of the second amplifiers. The receiver further includes a load coupled to the combining node, and receiver elements, wherein each one of the receiver elements comprises an input and an output, and the output of each one of the receiver elements is coupled to the input of a respective one of the first amplifiers.

A second aspect relates to a method for signal combining. The method includes receiving signals from receiver elements, amplifying the signals from the receiver elements into first amplified signals, and driving transmission lines with the first amplified signals. The method also includes receiving the first amplified signals from the transmission lines, amplifying the first amplified signals from the transmission lines into second amplified signals, and combining the second amplified signals into a combined signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Operating wireless communication systems (e.g., 5G communication systems) in the mmWave band allows the wireless communication systems to transmit signals with wider bandwidths for higher data rates. However, wireless communication systems operating in the mmWave band may suffer from high signal attenuation. To compensate for the high signal attenuation, a wireless device operating in the mmWave band includes a phased antenna array that allows the wireless device to receive and/or transmit signals with high directivity for improved range.

Figure 1:
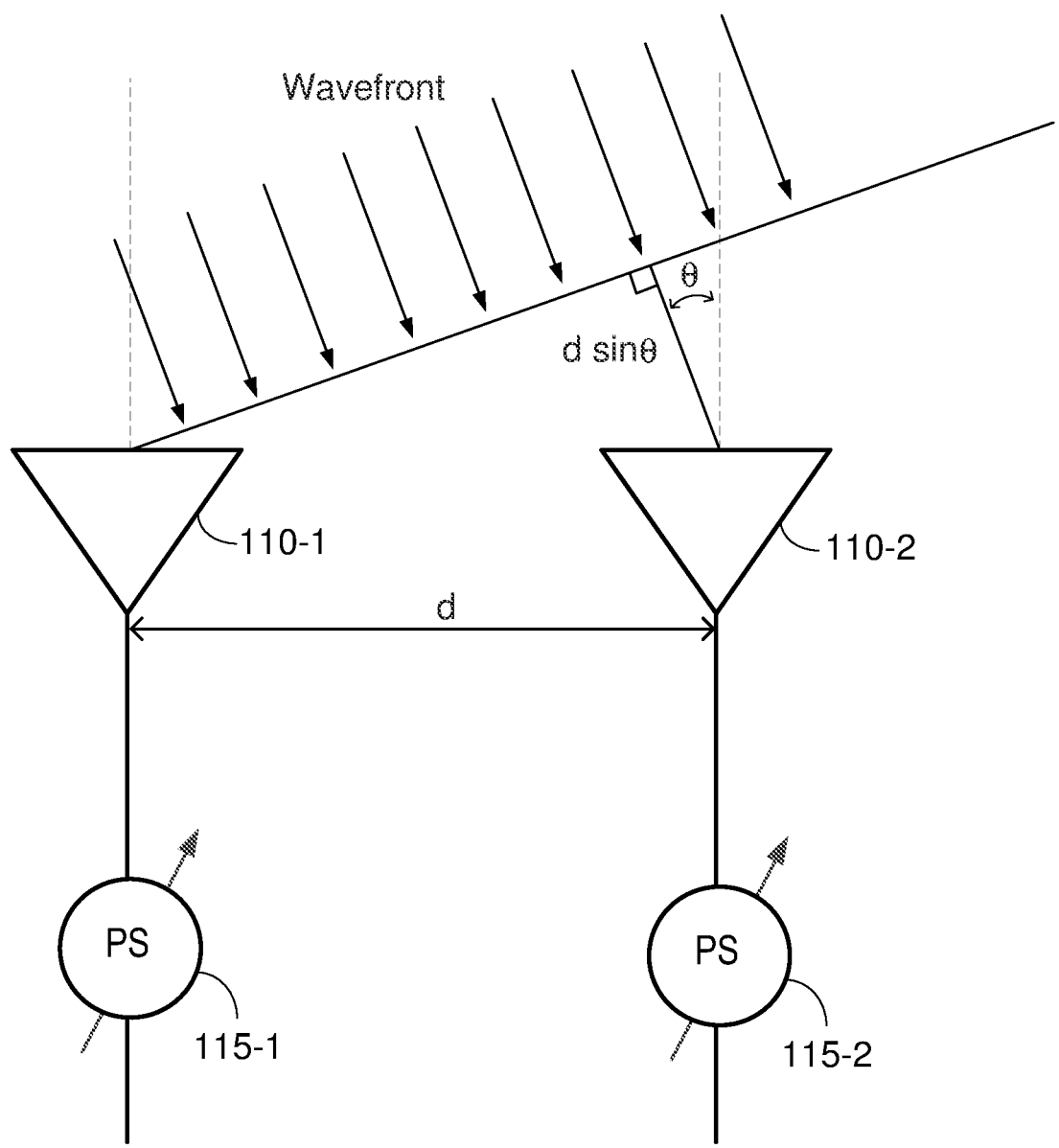
FIG. 1 illustrates an example of steering the receive direction of a phased antenna array using phase shifters according to certain aspects of the present disclosure.

The receive direction of a phased antenna array may be electronically steered by shifting the phases of signals received by antennas in the phased antenna array. An example of this is illustrated in FIG. 1, which shows an example of two adjacent antennas 110-1 and 110-2 in a phased antenna array. The antennas 110-1 to 110-2 are coupled to adjustable (i.e., tunable) phase shifters 115-1 to 115-2, respectively. Each phase shifter 115-1 and 115-2 is configured to shift the phase of the signal received by its respective antenna 110-1 and 110-2.

In this example, the distance (i.e., spacing) between the antennas 110-1 and 110-2 is d, and the wavefront of a radio signal to be received by the phased antenna array arrives at an angle θ with respect to the antenna boresight. In this example, the wavefront of the radio signal needs to travel an additional distance of d·sin θ to reach antenna 110-2 relative to antenna 110-1. This additional distance translates to a time delay of:

$$\Delta t = \frac{d \sin \theta}{c} \quad \text{(Eq. 1)}$$

where Δt is the time delay and c is the propagation speed of the radio signal. The time delay Δt can be expressed as a phase shift for a given frequency f as follows:

$$\Delta \phi = 2\pi f \Delta t \quad \text{(Eq. 2)}$$

where Δϕ is the phase shift between the antennas 110-1 and 110-2. Equations (1) and (2) can be combined to express the phase shift as follows:

$$\Delta \phi = 2\pi \left(\frac{d}{\lambda}\right) \sin \theta \quad \text{(Eq. 3)}$$

where λ is the wavelength of the radio signal, which is given by c/f. To set the receive direction of the phased antenna array to an angle of θ, the phase shifters 115-1 and 115-2 may be adjusted to provide a phase shift between the antennas 110(1) and 110(2) that undoes the phase shift Δϕ in equation (3). By undoing the phase shift Δϕ, the phase shifters 115-2 and 115-2 align the phases of signals received by the antennas 110-1 and 110-2 at the angle of θ, allowing the signals to be constructively combined. Although FIG. 1 shows an example of two antennas 110-1 and 110-2 for ease of discussion, it is to be appreciated that the principles illustrated in FIG. 1 can be extended to an entire phased antenna array or a subsection of a phased antenna array to receive signals in a desired direction.

Figure 2:
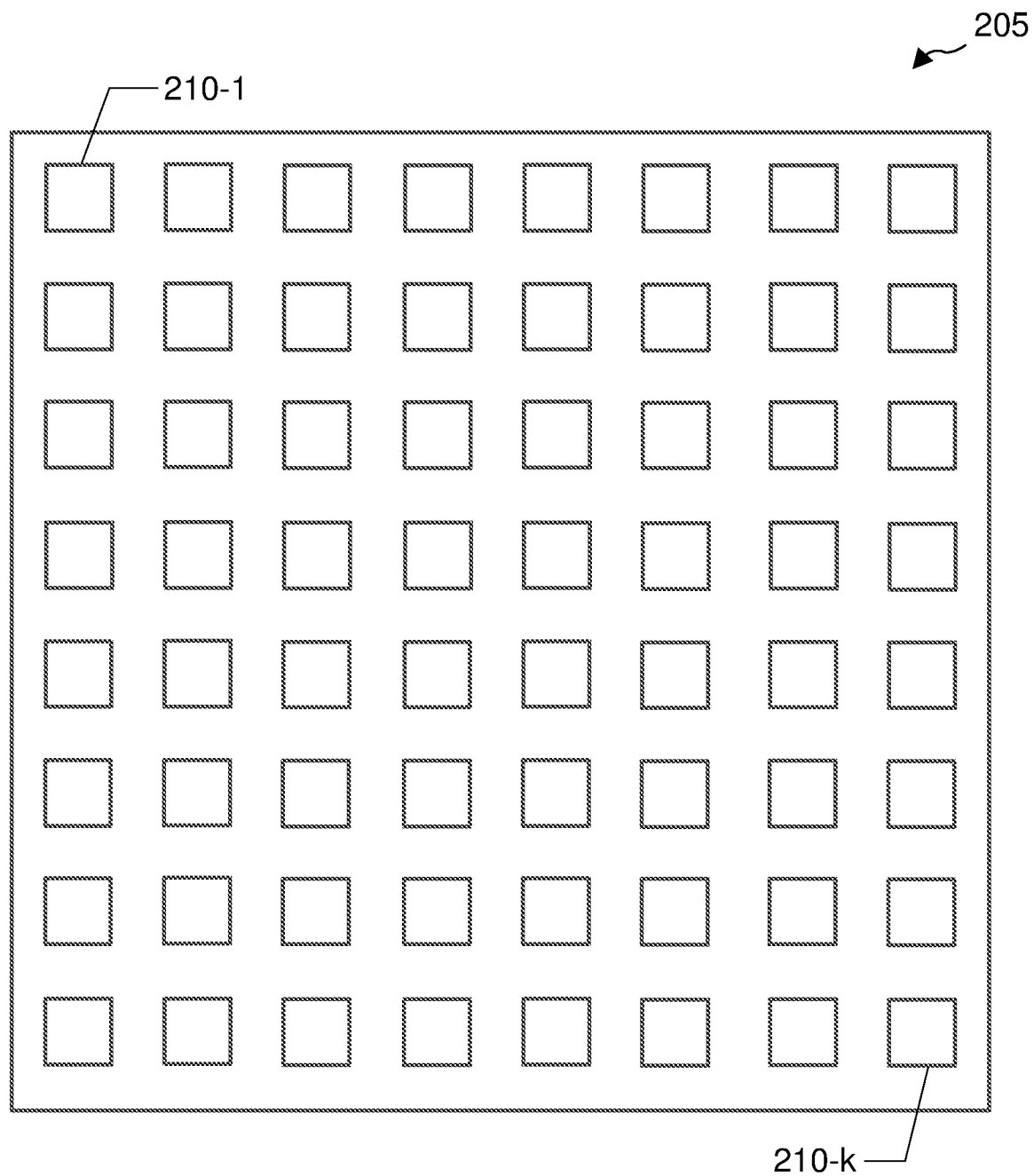
FIG. 2 shows an example of a phased antenna array according to certain aspects of the present disclosure.

FIG. 2 shows an example of a phased antenna array 205 including multiple antennas 210-1 to 210-k. In FIG. 2, each antenna 210-1 to 210-k is represented by a small square. Each antenna 210-1 to 210-k in the phased antenna array 205 may also be referred to as an antenna element or another term. In this example, the antennas 210-1 to 210-k are arranged in a two-dimensional array, although it is to be appreciated that the antennas 210-1 to 210-k may also be arranged in a one-dimensional array or a three-dimensional array. Each of the antennas 210-1 to 210-k may be implemented with a patch antenna or another type of antenna. In the example shown in FIG. 2, the phased antenna array 205 includes 64 antennas 210-1 to 210-k. However, it is to be appreciated that the phased antenna array 205 may include a different number of antennas 210-1 to 210-k. The phased antenna array 205 may include tens of antennas to hundreds of antennas.

The phased antenna array 205 may be incorporated in a wireless device (e.g., a 5G wireless device) to allow the wireless device to receive and/or transmit signals with high directivity. The receive direction of the phased antenna array 205 may be electronically steered using phase shifters (e.g., based on equation (3)). For example, the receive direction of the phased antenna array 205 may be set to point in the direction of another wireless device that transmits signals to the wireless device.

An advantage of operating the wireless device in the mmWave band is that the mmWave band allows the use of small antennas (e.g., in the millimeter range). The small sizes of the antennas 210-1 to 210-k in the mmWave band significantly reduces the area of the phased antenna array 205. This allows the phased antenna array 205 to be incorporated in a handset, a small base station (e.g., customer premises equipment (CPE)), or another wireless device.

Figure 3:
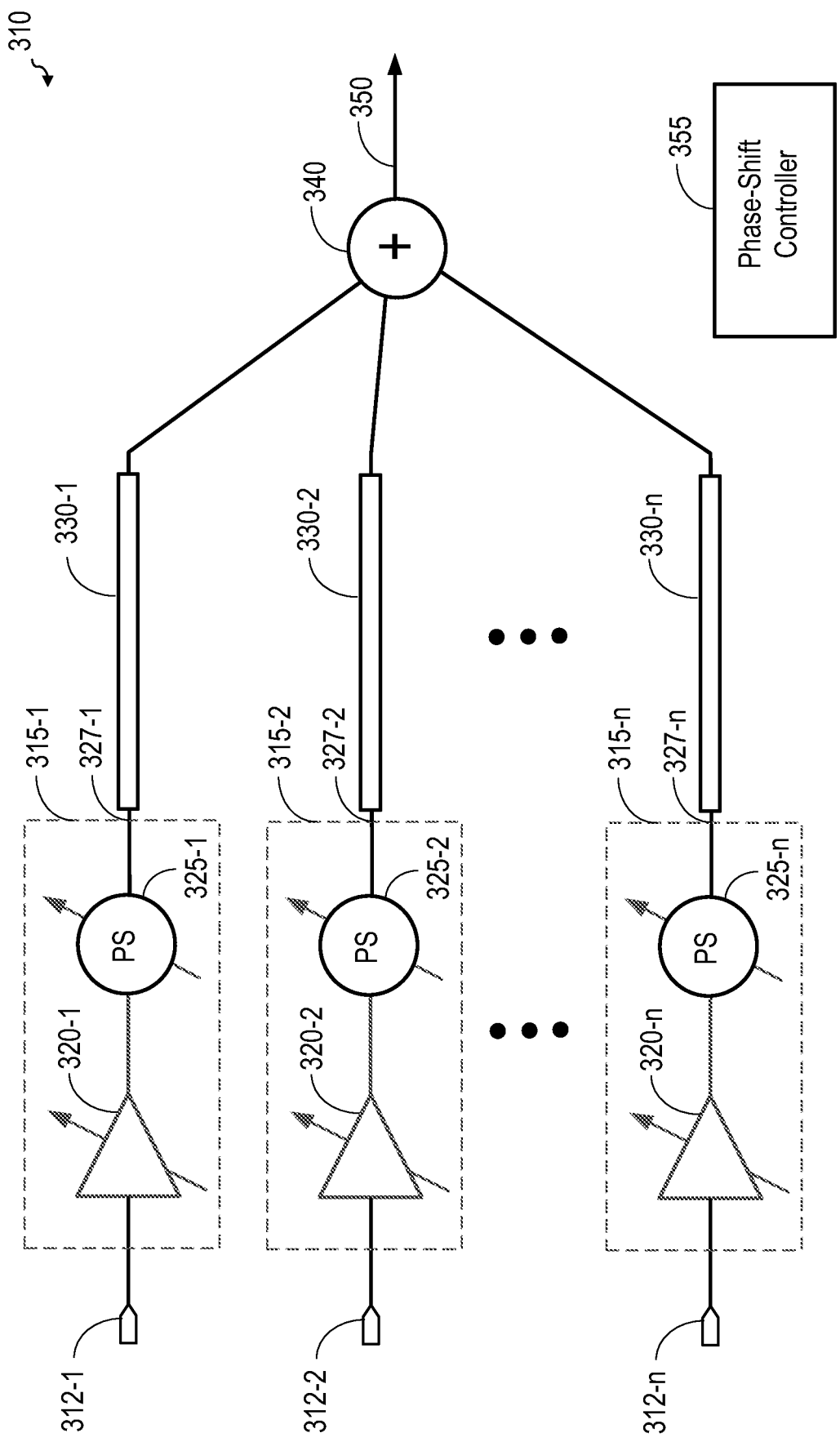
FIG. 3 shows an example of a phased-array receiver according to certain aspects of the present disclosure.

FIG. 3 shows an example of a phased-array receiver 310 for receiving signals from antennas in a phased antenna array (e.g., phased antenna array 205). The phased-array receiver 310 includes multiple receiver elements 315-1 to 315-n, in which each of the receiver elements 315-1 to 315-n is coupled to a respective antenna in the phased antenna array via a respective input 312-1 to 312-n. In one example, the number of receiver elements 315-1 to 315-n equals the number of antennas 210-1 to 210-k in the phased antenna array 205, in which case n equals k. In another example, the number of receiver elements 315-1 to 315-n is less than the number of antennas 210-1 to 210-k in the phased antenna array 205. In this example, each of the receiver elements 315-1 to 315-n may be coupled to a respective one of n of the antennas 210-1 to 210-k in the phased antenna array 205.

Each of the receiver elements 315-1 to 315-n includes a respective low noise amplifier (LNA) 320-1 to 320-n and a respective phase shifter 325-1 to 325-n. Each of the LNAs 320-1 to 320-n is configured to amplify the signal from its respective antenna (e.g., respective one of the antennas 210-1 to 210-k) and may have a variable gain.

Each of the phase shifters 325-1 to 325-n is configured to shift the phase of its respective signal by a respective phase shift. The phase shifters 325-1 to 325-n are used to set the receive direction of the phased antenna array (e.g., in a direction towards the transmitting device). In this regard, a phase-shift controller 355 sets the phase shifts of the phase shifters 325-1 to 325-$n$ so that the phase shifters 325-1 to 325-$n$ align the phases of signals received by the antennas in the desired receive direction. This allows the signals received by the antennas in the desired receive direction to be constructively combined, as discussed further below. For ease of illustration, the individual connections between the phase-shift controller 355 and the phase shifters 325-1 to 325-$n$ are not explicitly shown in FIG. 3.

The phased-array receiver 310 also includes multiple transmission lines 330-1 to 330-$n$ and a combiner 340. Each of the transmission lines 330-1 to 330-$n$ is coupled between an output 327-1 to 327-$n$ of a respective one of the receiver elements 315-1 to 315-$n$ and the combiner 340. The receiver elements 315-1 to 315-$n$ may be spaced apart from each other with the transmission lines 330-1 to 330-$n$ routing the output signals of the receiver elements 315-1 to 315-$n$ to the combiner 340.

The combiner 340 receives the output signals of the receiver elements 315 to 315-$n$ signals via the respective transmission lines 330-1 to 330-$n$, combines the output signals into a combined signal, and outputs the combined signal at an output 350 of the combiner 340. As discussed above, the phase shifters 325-1 to 325-$n$ align the phases of signals received by the antennas in the desired receive direction. As a result, the combiner 340 constructively combines the signals corresponding to the desired receive direction to generate the combined signal. The combiner 340 may output the combined signal to receive circuitry (not shown) for further processing (e.g., frequency down-conversion, filtering, analog-to-digital conversion, demodulation, baseband processing, etc.) or output the combined signal to another combiner (not shown) in a subsequent combining stage.

Figure 4:
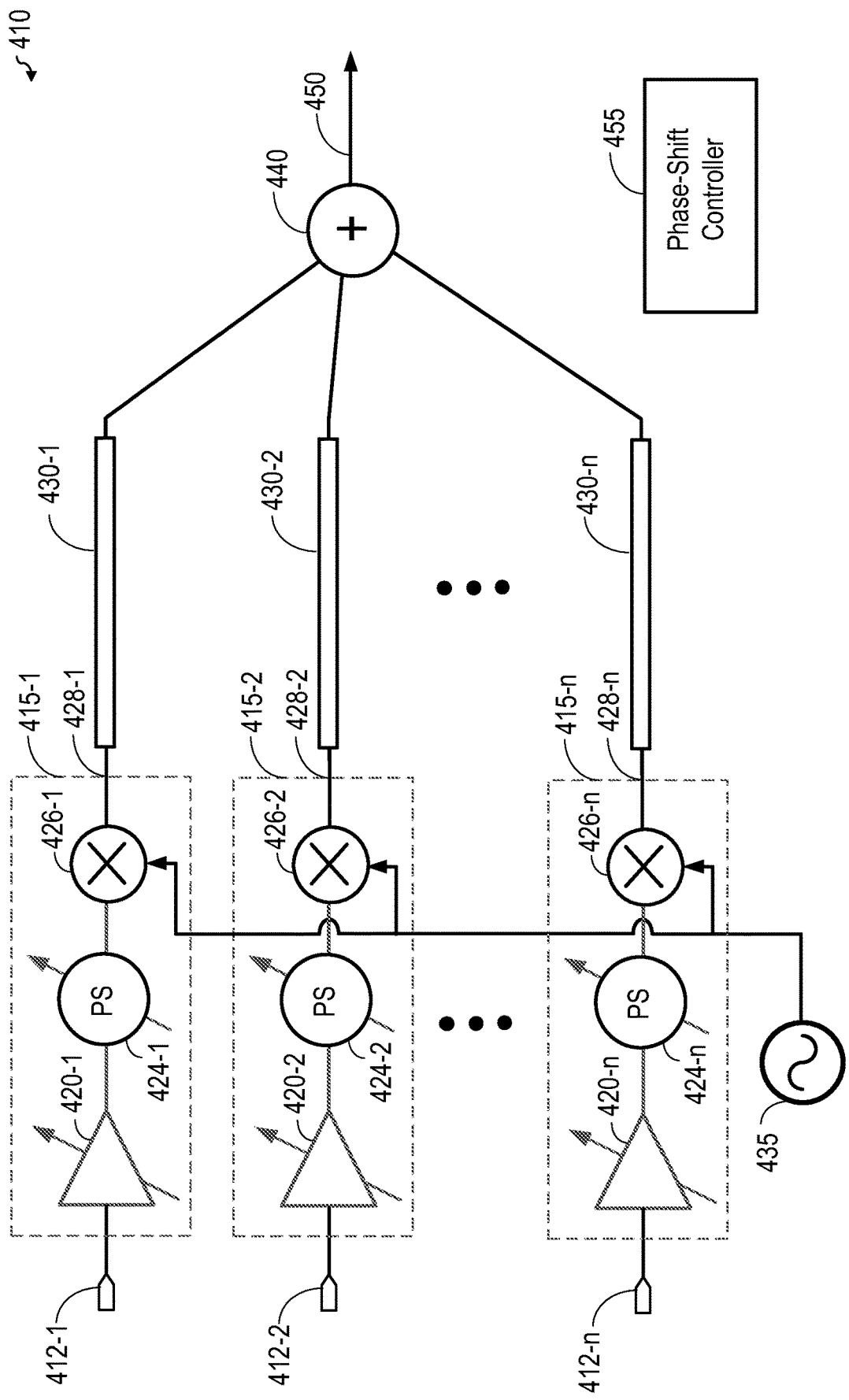
FIG. 4 shows another example of a phased-array receiver according to certain aspects of the present disclosure.

FIG. 4 shows another example of a phased-array receiver 410 for receiving signals from antennas in a phased antenna array (e.g., phased antenna array 205). The phased-array receiver 410 includes multiple receiver elements 415-1 to 415-$n$, in which each of the receiver elements 415-1 to 415-$n$ is coupled to a respective antenna in the phased antenna array via a respective input 412-1 to 412-$n$. In one example, the number of receiver elements 415-1 to 415-$n$ equals the number of antennas 210-1 to 210-$k$ in the phased antenna array 205, in which case n equals k. In another example, the number of receiver elements 415-1 to 415-$n$ is less than the number of antennas 210-1 to 210-$k$ in the phased antenna array 205. In this example, each of the receiver elements 415-1 to 415-$n$ may be coupled to a respective one of n of the antennas 210-1 to 210-$k$ in the phased antenna array 205.

Each of the receiver elements 415-1 to 415-$n$ includes a respective low noise amplifier (LNA) 420-1 to 420-$n$, a respective phase shifter 424-1 to 424-$n$, and a respective mixer 426-1 to 426-$n$. Each of the LNAs 420-1 to 420-$n$ is configured to amplify the signal from its respective antenna (e.g., respective one of the antennas 210-1 to 210-$k$) and may have a variable gain.

Each of the phase shifters 424-1 to 424-$n$ is configured to shift the phase of its respective signal by a respective phase shift. The phase shifters 424-1 to 424-$n$ are used to set the receive direction of the phased antenna array (e.g., in a direction towards the transmitting device). In this regard, a phase-shift controller 455 sets the phase shifts of the phase shifters 424-1 to 424-$n$ so that the phase shifters 424-1 to 424-$n$ align the phases of signals received by the antennas in the desired receive direction. This allows the signals received by the antennas in the desired receive direction to be constructively combined, as discussed further below. For ease of illustration, the individual connections between the phase-shift controller 455 and the phase shifters 425-1 to 425-$n$ are not explicitly shown in FIG. 4.

Each of the mixers 426-1 to 426-$n$ is configured to receive a local oscillator (LO) signal from a LO 435, and mix the signal from its respective phase shifter 424-1 to 424-$n$ with the LO signal to frequency down-convert the signal from its respective phase shifter 424-1 to 424-$n$. The frequency down-conversion may be from a radio frequency (RF) to an intermediate frequency (IF). Thus, in this example, frequency down-conversion is performed in the receiver elements 415-1 to 415-$n$ before signal combining.

The phased-array receiver 410 also includes multiple transmission lines 430-1 to 430-$n$ and a combiner 440. Each of the transmission lines 430-1 to 430-$n$ is coupled between an output 428-1 to 428-$n$ of a respective one of the receiver elements 415-1 to 415-$n$ and the combiner 440. The receiver elements 415-1 to 415-$n$ may be spaced apart from each other with the transmission lines 430-1 to 430-$n$ routing the output signals of the receiver elements 415-1 to 415-$n$ to the combiner 440.

The combiner 440 receives the output signals of the receiver elements 415 to 415-$n$ signals via the respective transmission lines 430-1 to 430-$n$, combines the output signals into a combined signal, and outputs the combined signal at an output 450 of the combiner 440. As discussed above, the phase shifters 424-1 to 424-$n$ align the phases of signals received by the antennas in the desired receive direction. As a result, the combiner 440 constructively combines the signals corresponding to the desired receive direction to generate the combined signal. The combiner 440 may output the combined signal to receive circuitry (not shown) for further processing (e.g., frequency down-conversion, filtering, analog-to-digital conversion, demodulation, baseband processing, etc.) or output the combined signal to another combiner (not shown) in a subsequent combining stage.

In the example in FIG. 4, the combiner 440 combines signals in the IF domain. This is because frequency down-conversion from RF to IF is performed at the mixers 426-1 to 426-$n$ in the receiver elements 415-1 to 415-$n$. As a result, the output signals of the receiver elements 415-1 to 415-$n$ (which are combined by the combiner 440) are IF signals. In contrast, the combiner 340 in FIG. 3 combines signals in the RF domain In the example in FIG. 3, frequency down-conversion is performed after signal combining.

The phased-array receiver 410 in FIG. 4 may include more hardware than the phased-array receiver 310 in FIG. 3. This is because the phased-array receiver 410 includes mixers 426-1 to 426-$n$ in the receiver elements 415-1 to 415-$n$ for frequency down-converting the RF signals from the antennas to IF signals before signal combining by the combiner 440. In contrast, the combined signal in FIG. 3 may be frequency down-converted from RF to IF using one mixer (not shown in FIG. 3). Although the phased-array receiver 410 may require more hardware, combining IF signals at the combiner 440 has the benefit of lowering the operating frequency of the combiner 440 compared with combining RF signals. The lower frequency at the combiner 440 may result in lower signal losses due to parasitics (e.g., parasitic capacitance) in the combiner 440, which improves the performance of the combiner 440. Thus, the additional hardware costs associated with including the mixers 426-1 to 426-$n$ in the receiver elements 415-1 to 415-$n$ may be offset by lower signal losses due to parasitics in the combiner 440.

Figure 5:
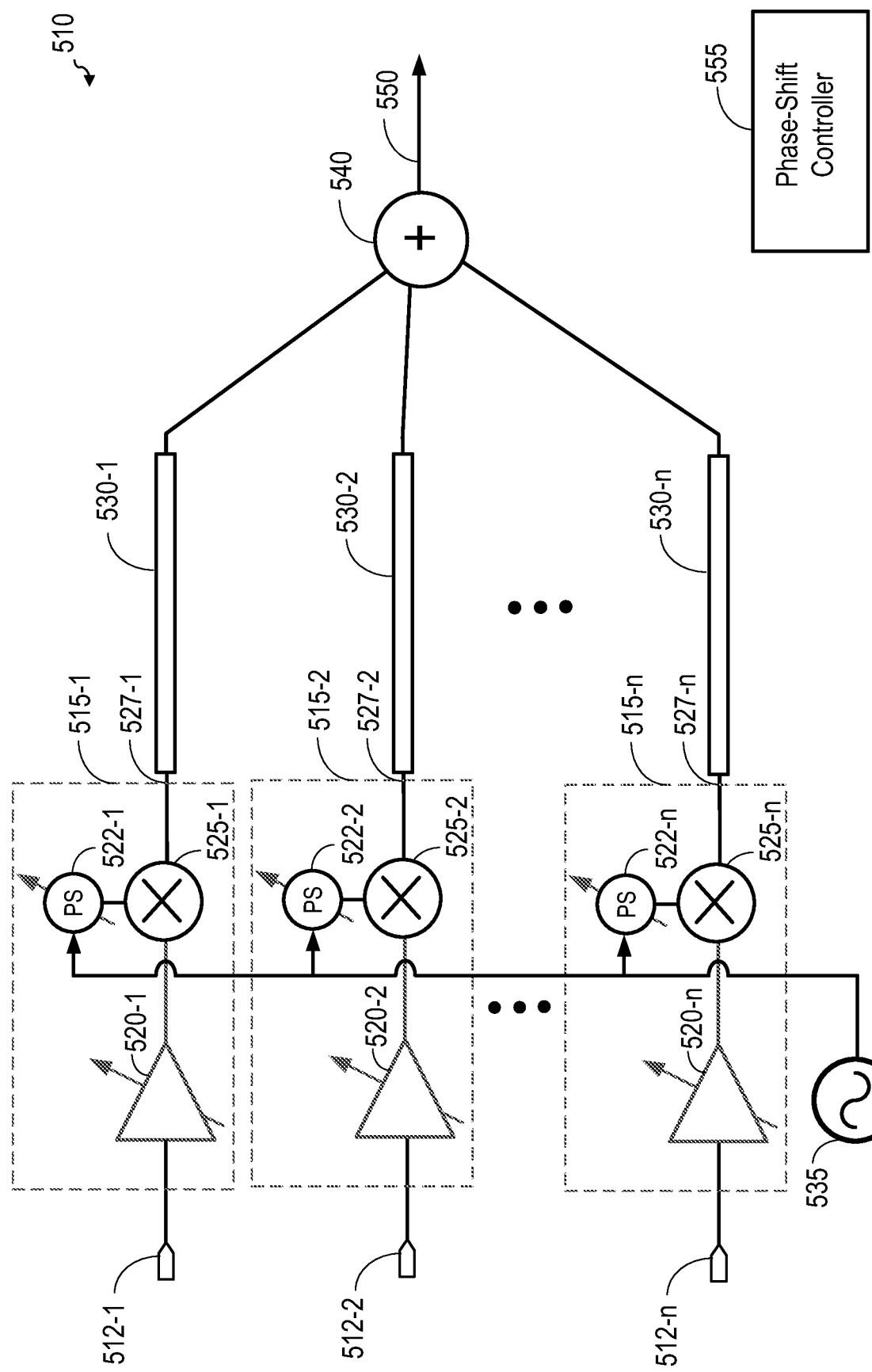
FIG. 5 shows yet another example of a phased-array receiver according to certain aspects of the present disclosure.

FIG. 5 shows another example of a phased-array receiver 510 for receiving signals from antennas in a phased antenna array (e.g., phased antenna array 205). The phased-array receiver 510 includes multiple receiver elements 515-1 to 515-n, in which each of the receiver elements 515-1 to 515-n is coupled to a respective antenna in the phased antenna array via a respective input 512-1 to 512-n. In one example, the number of receiver elements 515-1 to 515-n equals the number of antennas 210-1 to 210-k in the phased antenna array 205, in which case n equals k. In another example, the number of receiver elements 515-1 to 515-n is less than the number of antennas 210-1 to 210-k in the phased antenna array 205. In this example, each of the receiver elements 515-1 to 515-n may be coupled to a respective one of n of the antennas 210-1 to 210-k in the phased antenna array 205.

Each of the receiver elements 515-1 to 515-n includes a respective low noise amplifier (LNA) 520-1 to 520-n, a respective phase shifter 522-1 to 522-n, and a respective mixer 525-1 to 525-n. Each of the LNAs 520-1 to 520-n is configured to amplify the signal from its respective antenna (e.g., respective one of the antennas 210-1 to 210-k) and may have a variable gain.

Each of the phase shifters 522-1 to 522-n is configured to receive a local oscillator (LO) signal from a LO 535, and shift the phase of the received LO signal by a respective phase shift to generate a respective phase-shifted LO signal. Each of the phase shifters 522-1 to 522-n outputs its respective phase-shifted LO signal to its respective mixer 525-1 to 525-n.

Each of the mixers 525-1 to 525-n is configured to mix the signal from its respective LNA 520-1 to 520-n with the phase-shifted LO signal from its respective phase shifter 522-1 to 522-n to generate a frequency down-converted and phase-shifted version of the signal from its respective LNA 520-1 to 520-n. The frequency down-conversion may be from a radio frequency (RF) to an intermediate frequency (IF). In this case, the signals received by the receiver elements 515-1 to 515-n are RF signals and the output signals of the mixers 525-1 to 525-n are IF signals. Thus, in this example, frequency down-conversion and phase shifting are performed in the receiver elements 515-1 to 515-n.

In certain aspects, a phase-shift controller 555 sets the phase shifts of the phase shifters 522-1 to 522-n according to a desired receive direction (e.g., a direction towards the transmitting device). In this regard, the phase-shift controller 555 may set the phase shifts of the phase shifters 522-1 to 522-n so that the output signals of the mixers 525-1 to 525-n corresponding to the desired receive direction are approximately aligned in phase. This allows the signals corresponding to the desired receive direction to be constructively combined, as discussed further below. For ease of illustration, the individual connections between the phase-shift controller 555 and the phase shifters 522-1 to 522-n are not explicitly shown in FIG. 5.

The phased-array receiver 510 also includes multiple transmission lines 530-1 to 530-n and a combiner 540. Each of the transmission lines 530-1 to 530-n is coupled between an output 527-1 to 527-n of a respective one of the receiver elements 515-1 to 515-n and the combiner 540. The receiver elements 515-1 to 515-n may be spaced apart from each other with the transmission lines 530-1 to 530-n routing the output signals of the receiver elements 515-1 to 515-n to the combiner 540.

The combiner 540 receives the output signals of the receiver elements 515-1 to 515-n signals via the respective transmission lines 530-1 to 530-n, combines the output signals into a combined signal, and outputs the combined signal at an output 550 of the combiner 540. As discussed above, the output signals of the mixers 525-1 to 525-n corresponding to the desired receive direction are approximately aligned in phase. As a result, the combiner 540 constructively combines the signals corresponding to the desired receive direction to generate the combined signal. The combiner 540 may output the combined signal to receive circuitry (not shown) for further processing (e.g., frequency down-conversion, filtering, analog-to-digital conversion, demodulation, baseband processing, etc.) or output the combined signal to another combiner (not shown) in a subsequent combining stage.

Figure 6:
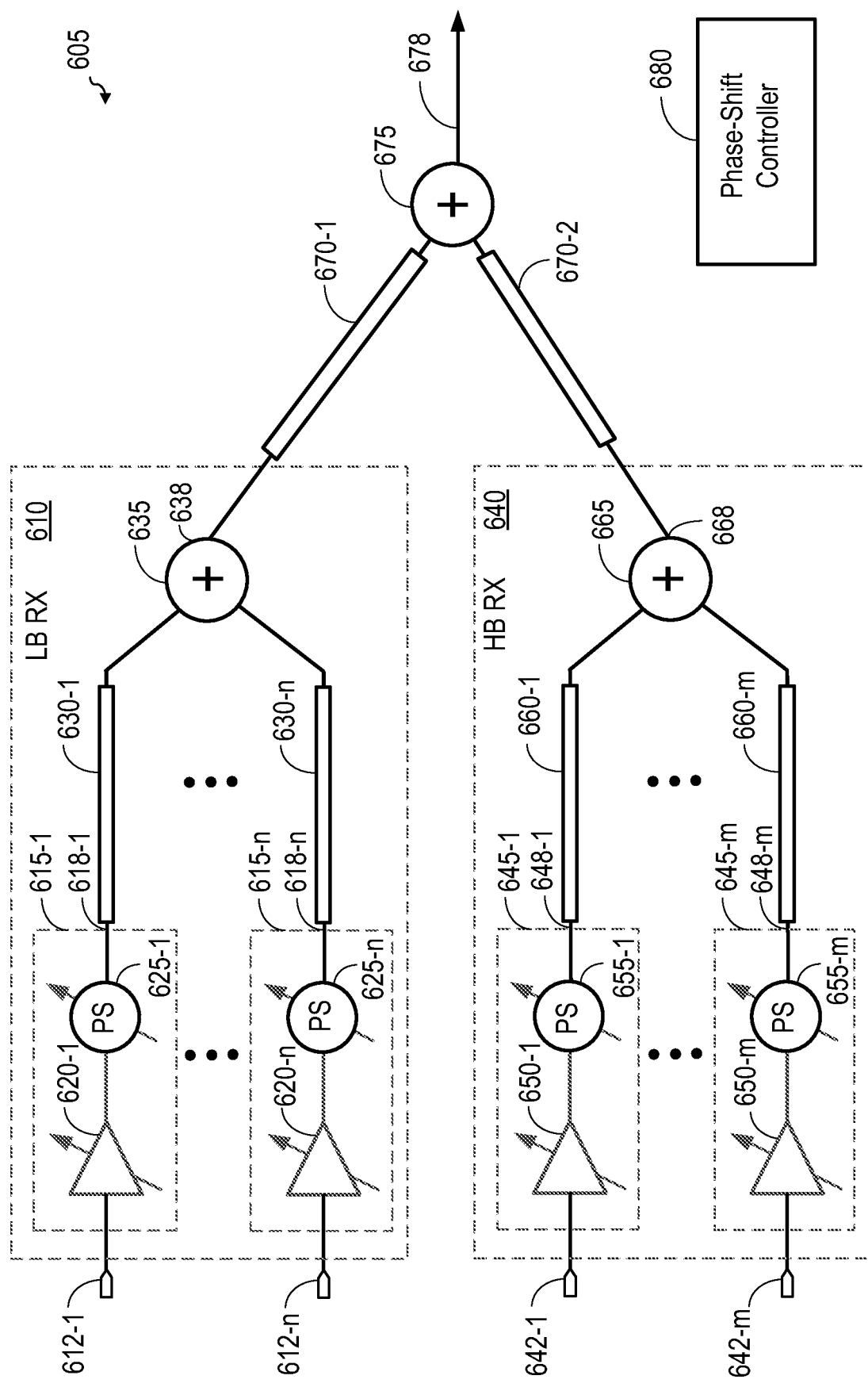
FIG. 6 shows an example of a dual-band phased-array receiver according to certain aspects of the present disclosure.

FIG. 6 shows an example of a dual-band phased-array receiver 605 according to certain aspects of the present disclosure. The dual-band phased-array receiver 605 includes a low band (LB) receiver 610 and a high band (HB) receiver 640. The LB receiver 610 is used for receiving signals from antennas of a phased antenna array in a LB, and the HB receiver 640 is used for receiving signals from antennas of a phased antenna array in a HB. In one example, the LB may be in the frequency range of 24-33 GHz, and the HB may be in the frequency range of 37-43 GHz. It is to be appreciated that the LB and the HB are not limited to the exemplary frequency ranges given above. Generally, the LB may be in a first frequency range and the HB may be in a second frequency range, in which the first frequency range is lower than the second frequency range. The LB receiver 610 and the HB receiver 640 may receive signals from the same phased antenna array or receive signals from separate phased antenna arrays.

The LB receiver 610 includes multiple receiver elements 615-1 to 615-n, in which each of the receiver elements 615-1 to 615-n is coupled to a respective antenna of a phased antenna array (e.g., phased antenna array 205) via a respective input 612-1 to 612-n. Each of the receiver elements 615-1 to 615-n includes a respective low noise amplifier (LNA) 620-1 to 620-n and a respective phase shifter 625-1 to 625-n. Each of the LNAs 620-1 to 620-n is configured to amplify the signal from its respective antenna and may have a variable gain. Each of the phase shifters 625-1 to 625-n is configured to shift the phase of its respective signal by a respective phase shift according to a desired receive direction for the LB, as discussed further below.

The LB receiver 610 also includes multiple transmission lines 630-1 to 630-n and a first combiner 635. Each of the transmission lines 630-1 to 630-n is coupled between an output 618-1 to 618-n of a respective one of the receiver elements 615-1 to 615-n and the first combiner 635.

The first combiner 635 receives the output signals of the receiver elements 615-1 to 615-n via the respective transmission lines 630-1 to 630-n, combines the output signals into a LB combined signal, and outputs the LB combined signal at an output 638 of the first combiner 635.

The HB receiver 640 includes multiple receiver elements 645-1 to 645-m, in which each of the receiver elements 645-1 to 645-m is coupled to a respective antenna of a phased antenna array (e.g., phased antenna array 205) via a respective input 642-1 to 642-m. The phased antenna array coupled to the HB receiver 640 may be the same phased antenna array coupled to the LB receiver 610 or a different phased antenna array. The number of receiver elements 645-1 to 645-m in the HB receiver 640 may be the same as the number of receiver elements 615-1 to 615-n in the LB receiver 610 or different.

Each of the receiver elements 645-1 to 645-m includes a respective low noise amplifier (LNA) 650-1 to 650-m and a respective phase shifter 655-1 to 655-m. Each of the LNAs 650-1 to 650-*m* is configured to amplify the signal from its respective antenna and may have a variable gain. Each of the phase shifters 655-1 to 655-*m* is configured to shift the phase of its respective signal by a respective phase shift according to a desired receive direction for the HB, as discussed further below.

The HB receiver 640 also includes multiple transmission lines 660-1 to 660-*m* and a second combiner 665. Each of the transmission lines 660-1 to 660-*m* is coupled between an output 648-1 to 648-*m* of a respective one of the receiver elements 645-1 to 645-*m* and the second combiner 665.

The second combiner 665 receives the output signals of the receiver elements 645-1 to 645-*m* via the respective transmission lines 660-1 to 660-*m*, combines the output signals into an HB combined signal, and outputs the HB combined signal at an output 668 of the second combiner 665.

The dual-band phased array receiver 605 also includes a third combiner 675. The third combiner 675 is coupled to the output 638 of the first combiner 635 via transmission line 670-1 and coupled to the output 668 of the second combiner 665 via transmission line 670-2. The third combiner 675 is configured to combine the LB combined signal from the first combiner 635 and the HB combined signal from the second combiner 665 into a dual-band combined signal, and output the dual-band combined signal at an output 678 of the third combiner 675. The third combiner 675 may output the dual-band combined signal to receive circuitry (not shown) for further processing (e.g., frequency down-conversion, filtering, demodulation, analog-to-digital conversion, baseband processing, etc.) or output the dual-band combined signal to another combiner (not shown) in a subsequent combining stage.

In certain aspects, the phase shifts of the phase shifters 625-1 to 625-*n* and 655-1 to 655-*m* are controlled by a phase-shift controller 680. For ease of illustration, the individual connections between the phase-shift controller 680 and the phase shifters 625-1 to 625-*n* and 655-1 to 655-*m* are not explicitly shown in FIG. 6.

The phase-shift controller 680 sets the phase shifts of the phase shifters 625-1 to 625-*n* in the LB receiver 610 according to the desired receive direction for the LB (e.g., in a direction towards the device transmitting in the LB). In this regard, the phase-shift controller 680 sets the phase shifts of the phase shifters 625-1 to 625-*n* so that the phase shifters 625-1 to 625-*n* align the phases of signals corresponding to the desired receive direction for the LB. This allows the first combiner 635 to constructively combine the signals corresponding to the desired receive direction for the LB.

The phase-shift controller 680 also sets the phase shifts of the phase shifters 655-1 to 655-*m* in the HB receiver 640 according to the desired receive direction for the HB (e.g., in a direction towards the device transmitting in the HB). In this regard, the phase-shift controller 680 sets the phase shifts of the phase shifters 655-1 to 655-*m* so that the phase shifters 655-1 to 655-*m* align the phases of signals corresponding the desired receive direction for the HB. This allows the second combiner 665 to constructively combine the signals corresponding to the desired receive direction for the HB. The desired receive direction for the HB may be different than the desired direction for the LB.

Figure 7:
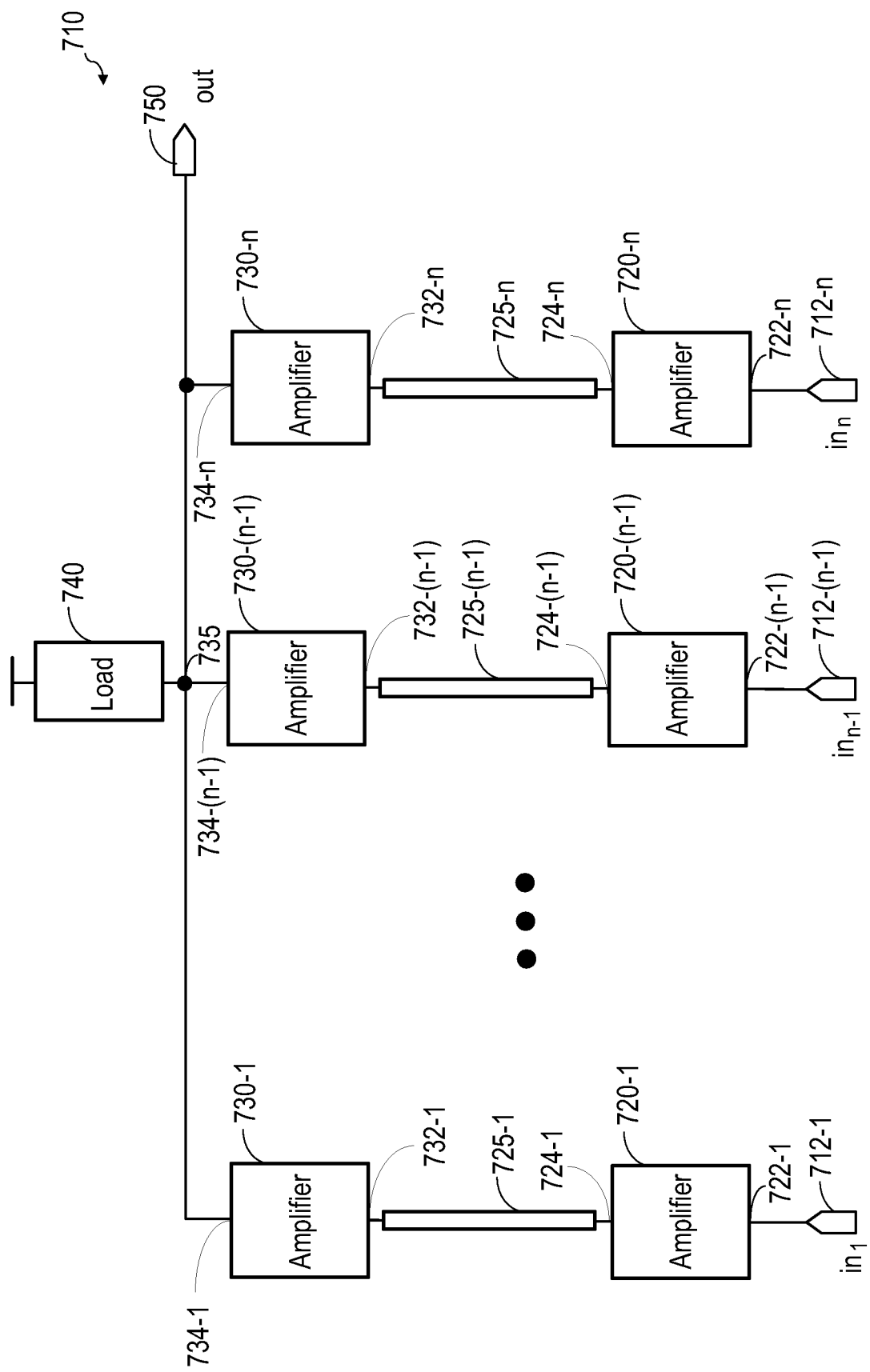
FIG. 7 shows an example of a combiner according to certain aspects of the present disclosure.

FIG. 7 shows an exemplary combiner 710 according to certain aspects of the present disclosure. The combiner 710 has multiple inputs 712-1 to 712-*n* (labeled "In$_1$" to "In$_n$") and an output 750 (labeled "out"). The combiner 710 is configured to receive signals at the inputs 712-1 to 712-*n*, combine the received signals into a combined signal, and output the combined signal at the output 750. The signals input to the combiner 710 may come from receiver elements (e.g., receiver elements 315-1 to 315-*n*, 415-1 to 415-*n*, 515-1 to 515-*n*, 615-1 to 615-*n*, or 645-1 to 645-*m*). In this case, each of the inputs 712-1 to 712-*n* of the combiner 710 is coupled to the output of a respective one of the receiver elements. The combiner 710 may output the combined signal to receive circuitry (not shown) for further processing (e.g., frequency down-conversion, filtering, analog-to-digital conversion, demodulation, baseband processing, etc.) or output the combined signal to another combiner (not shown) in a subsequent combining stage.

The combiner 710 includes multiple first amplifiers 720-1 to 720-*n*, multiple transmission lines 725-1 to 725-*n*, multiple second amplifiers 730-1 to 730-*n*, and a load 740. The transmission lines 725-1 to 725-*n* are used for routing signals to be combined by the combiner 710, as discussed further below.

Each of the first amplifiers 720-1 to 720-*n* has an input 722-1 to 722-*n* coupled to a respective one of the inputs 712-1 to 712-*n* of the combiner 710, and an output 724-1 to 724-*n* coupled to a first end of a respective one of the transmission lines 725-1 to 725-*n*. For the example in which each of the inputs 712-1 to 712-*n* of the combiner 710 is coupled to the output of a respective receiver element, the input of each of the first amplifiers 720-1 to 720-*n* receives the output signal of the respective receiver element. Each of the first amplifiers 720-1 to 720-*n* is configured to amplify the signal at its respective input 722-1 to 722-*n*, and output the resulting amplified signal to the respective transmission line 725-1 to 725-*n*. Each of the first amplifiers 720-1 to 720-*n* may be implemented with a current amplifier, a transconductance amplifier, a voltage amplifier, or another type of amplifier.

Each of the second amplifiers 730-1 to 730-*n* has an input 732-1 to 732-*n* coupled to a second end of a respective one of the transmission lines 725-1 to 725-*n*, and an output 734-1 to 734-*n* coupled to a combining node 735. As shown in FIG. 7, each of the transmission lines 725-1 to 725-*n* is coupled between the output 724-1 to 724-*n* of the respective first amplifier 720-1 to 720-*n* and the input 732-1 to 732-*n* of the respective second amplifier 730-1 to 730-*n* for routing signals from the respective first amplifier 720-1 to 720-*n* to the respective second amplifier 730-1 to 730-*n*. The transmission lines 725-1 to 725-*n* may include metal traces on one or more chips (i.e., dies), metal traces on a printed circuit board, cables (e.g., coaxial cables), or any combination thereof. Although the transmission lines 725-1 to 725-*n* are shown as being straight in FIG. 7, it is to be appreciated that this need not be the case. For example, one or more of the transmission lines 725-1 to 725-*n* may follow non-straight paths (e.g., depending on the layout of the first amplifiers 720-1 to 720-*n* and the second amplifiers 730-1 to 730-*n*).

The load 740 is coupled between a voltage supply rail and the combining node 735, and provides an output load for the second amplifiers 730-1 to 730-*n*. The load 740 may be implemented with an inductor, a choke, a bias-T network, a resonator, or another type of load, as discussed further below.

Each of the second amplifiers 730-1 to 730-*n* may be configured to amplify the signal from its respective transmission line 725-1 to 725-*n* and/or function as a buffer amplifier (e.g., provide high load isolation between the load 740 and the respective transmission line 725-1 to 725-*n*). The output signals of the second amplifiers 730-1 to 730-*n* are combined at the combining node 735 to generate the combined signal. In one example, the output signals of the second amplifiers 730-1 to 730-n are currents that are combined into a combined current at the combining node 735. In this example, the combined current flows through the load 740 to generate a voltage that provides the combined signal of the combiner 710. The combined signal is output at the output 750 of the combiner 710. The combiner 710 may output the combined signal to receive circuitry (not shown) for further processing or another combiner (not shown) in a subsequent combining stage.

Figure 8:
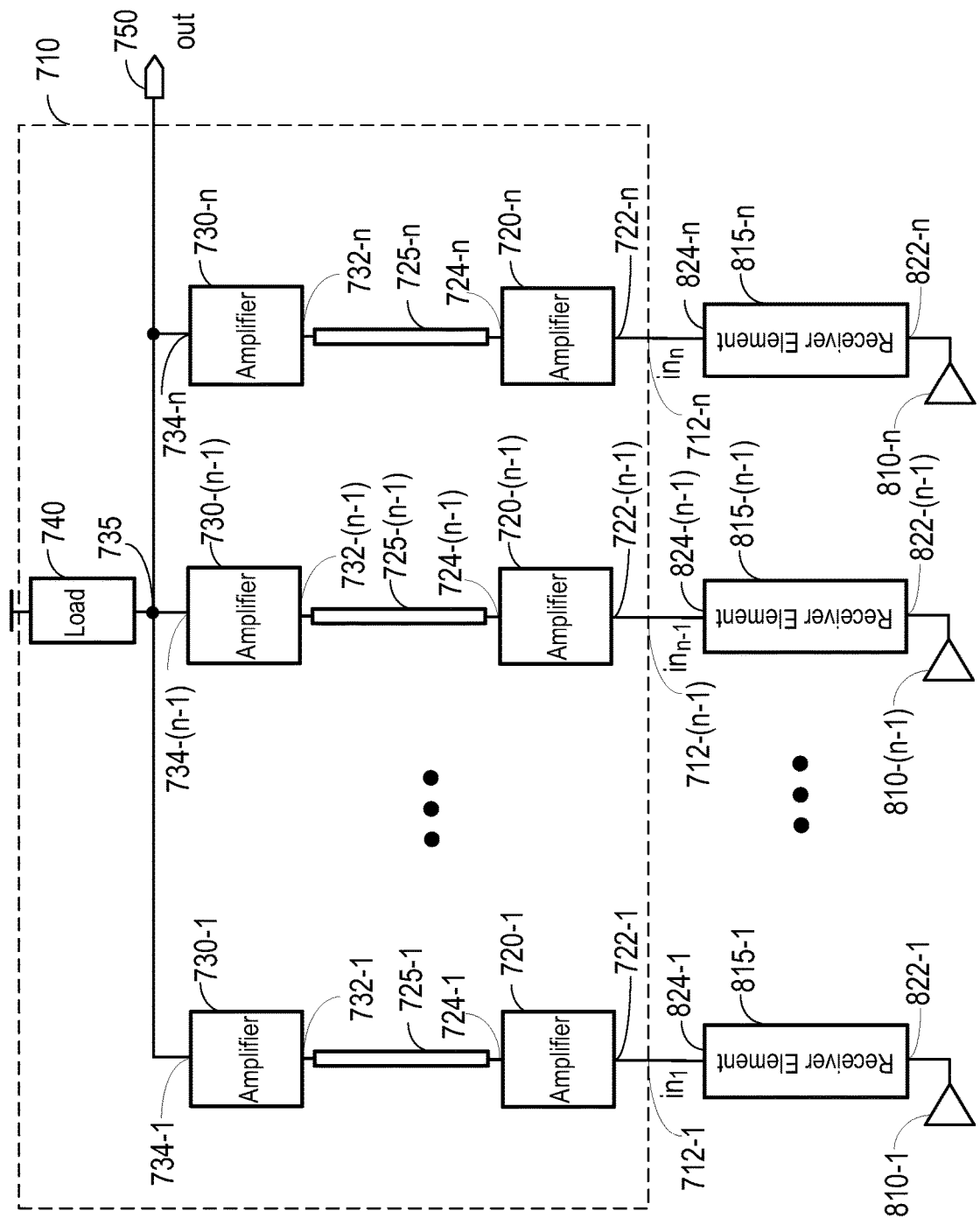
FIG. 8 shows an example in which inputs of the combiner are coupled to respective receiver elements according to certain aspects of the present disclosure.

As discussed above, each of the inputs 712-1 to 712-n of the combiner 710 may be coupled to the output of a respective receiver element. In this regard, FIG. 8 shows an example of receiver elements 815-1 to 815-n coupled to respective inputs 712-1 to 712-n of the combiner 710. In this example, the receiver elements 815-1 to 815-n may be implemented with the exemplary receiver elements 315-1 to 315-n in FIG. 3, the exemplary receiver elements 415-1 to 415-n in FIG. 4, the exemplary receiver elements 515-1 to 515-n in FIG. 5, the exemplary receiver elements 615-1 to 615-n in FIG. 6, or the exemplary receiver elements 645-1 to 645-m in FIG. 6.

Each of the receiver elements 815-1 to 815-n has a respective input 822-1 to 822-n coupled to a respective antenna 810-1 to 810-n and a respective output 824-1 to 824-n coupled to the respective input 712-1 to 712-n of the combiner 710. The antennas 810-1 to 810-n may be antennas in a phased antenna array (e.g., two or more of the antennas 210-1 to 210-k in the phased antenna array 205). Each of the receiver elements 815-1 to 815-n is configured to receive a respective signal (e.g., respective RF signal) from the respective antenna 810-1 to 810-n via the respective input 822-1 to 822-n, and process the respective signal. For example, each of the receiver elements 815-1 to 815-n may shift the phase of the respective signal by a respective phase shift to set the receive direction of the phased antenna array, as discussed above. In this example, each of the receiver elements 815-1 to 815-n may include a respective phase shifter (e.g., respective one of the phase shifters 325-1 to 325-n, 424-1 to 424-n, 522-1 to 522-n, 625-1 to 625-n, or 655-1 to 655-m) for shifting the phase of the respective signal. The phase settings for the phase shifters of the receiver elements 815-1 to 815-n may be the same or different.

Each of the receiver elements 815-1 to 815-n may also be configured to amplify the respective signal. In this example, each of the receiver elements 815-1 to 815-n may include a respective LNA (e.g., respective one of the LNAs 320-1 to 320-n, 420-1 to 420-n, 520-1 to 520-n, 620-1 to 620-n, or 650-1 to 650-m) for amplifying the respective signal.

Each of the receiver elements 815-1 to 815-n may also be configured to frequency down-convert the respective signal (e.g., from RF to IF). In this example, each of the receiver elements 815-1 to 815-n may include a respective mixer (e.g., respective one of the mixers 426-1 to 426-n or 525-1 to 525-n) for frequency down-converting the respective signal.

Each of the receiver elements 815-1 to 815-n outputs the respective processed signal (e.g., amplified, phase-shifted and/or frequency down-converted signal) at the respective output 824-1 to 824-n. The processed signals output at the outputs 824-1 to 824-n of the receiver elements 815-1 to 815-n provide the output signals of the receiver elements 815-1 to 815-n.

The combiner 710 receives the output signals of the receiver elements 815-1 to 815-n via the respective inputs 712-1 to 712-n, combines the received output signals into a combined signal, and outputs the combined signal at the output 750, as discussed above with reference to FIG. 7. The combiner 710 may output the combined signal to receive circuitry (not shown) for further processing (e.g., frequency down-conversion, filtering, analog-to-digital conversion, demodulation, baseband processing, etc.) or output the combined signal to another combiner (not shown) in a subsequent combining stage.

For the example in which the receiver elements 815-1 to 815-n are implemented with the exemplary receiver elements 315-1 to 315-n in FIG. 3, the inputs 822-1 to 822-n correspond to the inputs 312-1 to 312-n in FIG. 3, and the outputs 824-1 to 824-n correspond to the outputs 327-1 to 327-n in FIG. 3.

For the example in which the receiver elements 815-1 to 815-n are implemented with the exemplary receiver elements 415-1 to 415-n in FIG. 4, the inputs 822-1 to 822-n correspond to the inputs 412-1 to 412-n in FIG. 4, and the outputs 824-1 to 824-n correspond to the outputs 428-1 to 428-n in FIG. 4.

For the example in which the receiver elements 815-1 to 815-n are implemented with the exemplary receiver elements 515-1 to 515-n in FIG. 5, the inputs 822-1 to 822-n correspond to the inputs 512-1 to 512-n in FIG. 5, and the outputs 824-1 to 824-n correspond to the outputs 527-1 to 527-n in FIG. 5.

For the example in which the receiver elements 815-1 to 815-n are implemented with the exemplary receiver elements 615-1 to 615-n in FIG. 6, the inputs 822-1 to 822-n correspond to the inputs 612-1 to 612-n in FIG. 6, and the outputs 824-1 to 824-n correspond to the outputs 618-1 to 618-n in FIG. 6.

For the example in which the receiver elements 815-1 to 815-n are implemented with the exemplary receiver elements 645-1 to 645-m in FIG. 6, the inputs 822-1 to 822-n correspond to the inputs 642-1 to 642-m in FIG. 6, and the outputs 824-1 to 824-n correspond to the outputs 648-1 to 648-m in FIG. 6. In this example, "n" in FIG. 8 (which indicates the number of receiver elements 815-1 to 815-n) is not necessarily equal to "n" in FIG. 6 (which indicates the number of receiver elements 615-1 to 615-n in the LB receiver 610).

It is to be appreciated that the combiner 710 is not limited to combining signals from receiver elements. For example, the combiner 710 may also be used to combine signals from two or more combiners in a previous combining stage. In one example, the combiner 710 may be used to combine the LB combined signal and the HB combined signal in FIG. 6 into the dual-band combined signal. In this example, a first one of the inputs 712-1 to 712-n of the combiner 710 is coupled to the output 638 of the first combiner 635 and a second one of the inputs 712-1 to 712-n of the combiner 710 is coupled to the output 668 of the second combiner 665. The combiner 710 combines the output signals of the first and second combiners 635 and 668 into the dual-band combined signal, and outputs the dual-band combined signal at the output 750 (which corresponds to the output 678 of the third combiner 675 in FIG. 6).

In certain aspects, each of the first amplifiers 720-1 to 720-n is configured to drive the respective transmission line 725-1 to 725-n with a respective output current. In one example, each of the first amplifiers 720-1 to 720-n is implemented with a current amplifier configured to receive a respective input current (e.g., from the output of the respective one of the receiver elements 815-1 to 815-n), amplify the respective input current to generate the respective output current, and drive the respective transmission line with the respective output current. In another example, each of first amplifiers 720-1 to 720-n is implemented with a transconductance amplifier configured to receive a respective input voltage (e.g., from the output of the respective one of the receiver elements 815-1 to 815-n), convert the respective input voltage into the respective output current, and drive the respective transmission line with the respective output current.

Driving the transmission lines 725-1 to 725-n with currents may improve signal integrity compared with driving the transmission lines 725-1 to 725-n with voltages, as explained further below.

In one example, the receiver elements 815-1 to 815-n may be spaced far apart from each other. For example, each of the receiver elements 815-1 to 815-n may be located near its respective antenna 810-1 to 810-n in the phased antenna array (e.g., phased antenna array 205). In this example, the antennas 810-1 to 810-n in the phased antenna array may be spaced far apart, causing the receiver elements 815-1 to 815-n to also be spaced far apart.

In the above example, each of the first amplifiers 720-1 to 720-n may be located near its respective receiver element 815-1 to 815-n. This may be done to reduce signal losses between the first amplifiers 720-1 to 720-n and the respective receiver elements 815-1 to 815-n. Since the receiver elements 815-1 to 815-n are spaced far apart in this example, the first amplifiers 720-1 to 720-n may also be spaced far apart. The second amplifiers 730-1 to 730-n may be located next to each other near the combining node 735 to reduce signal losses between the second amplifiers 730-1 to 730-n and the combining node 735. As a result, the first amplifiers 720-1 to 720-n may be spaced far apart from the second amplifiers 730-1 to 730-n. Thus, in this example, the lengths of the transmission lines 725-1 to 725-n may need to be relatively long in order to route signals from the outputs 724-1 to 724-n of the first amplifiers 720-1 to 720-n to the inputs 732-1 to 732-n of the second amplifiers 730-1 to 730-n.

In the above example, driving the transmission lines 725-1 to 725-n with voltages may result in large amounts of signal losses between the first amplifiers 720-1 to 720-n and the second amplifiers 730-1 to 730-n. This is because the resistance of each transmission line 725-1 to 725-n increases with increasing length, which increases the IR voltage drop across each transmission line 725-1 to 725-n. Thus, the relatively long lengths of the transmission lines 725-1 to 725-n in this example result in increased IR voltage drops across the transmission lines 725-1 to 725-n. The increased IR voltage drops across the transmission lines 725-1 to 725-n may significantly reduce the voltages that reach the inputs 732-1 to 732-n of the second amplifiers 730-1 to 730-n.

Driving the transmission lines 725-1 to 725-n with currents may significantly reduce signal losses between the first amplifiers 720-1 to 720-n and the second amplifiers 730-1 to 730-n. This is because the currents flowing through the transmission lines 725-1 to 725-n are not reduced by IR voltage drops across the transmission lines 725-1 to 725-n. Thus, unlike voltages, the currents do not suffer from significant losses due to IR voltage drops across the transmission lines 725-1 to 725-n. The reduction in signal losses facilitates signal routing over long distances (e.g., for the case where the first amplifiers 720-1 to 720-n are spread out and the second amplifiers 730-1 to 730-n are located close together near the combining node 735).

In certain aspects, each of the first amplifiers 720-1 to 720-n has a high output impedance so that the output of each of the first amplifiers 720-1 to 720-n approaches an ideal current source (which has infinite output impedance). This helps ensure that most of the output current generated by each of the first amplifiers 720-1 to 720-n flows through the respective transmission line 725-1 to 725-n. In these aspects, each of the first amplifiers 720-1 to 720-n may be implemented with a current amplifier or a transconductance amplifier.

Each of the second amplifiers 730-1 to 730-n may have a low input impedance. This helps ensure that most of the current flowing through each of the transmission lines 725-1 to 725-n flows through the input 732-1 to 732-n of the respective one of the second amplifiers 730-1 to 730-n.

Thus, the first amplifiers 720-1 to 720-n may have high output impedances and the second amplifiers 730-1 to 730-m may have low input impedances. This helps ensure that most of the output currents generated by the first amplifiers 720-1 to 720-n flows through the inputs 732-1 to 723-n of the second amplifiers 730-1 to 730-m for high efficiency. In one example, the output impedance of each of the first amplifiers 720-1 to 720-n is at least ten times greater than the input impedance of the respective one of the second amplifiers 730-1 to 730-n.

Figure 9:
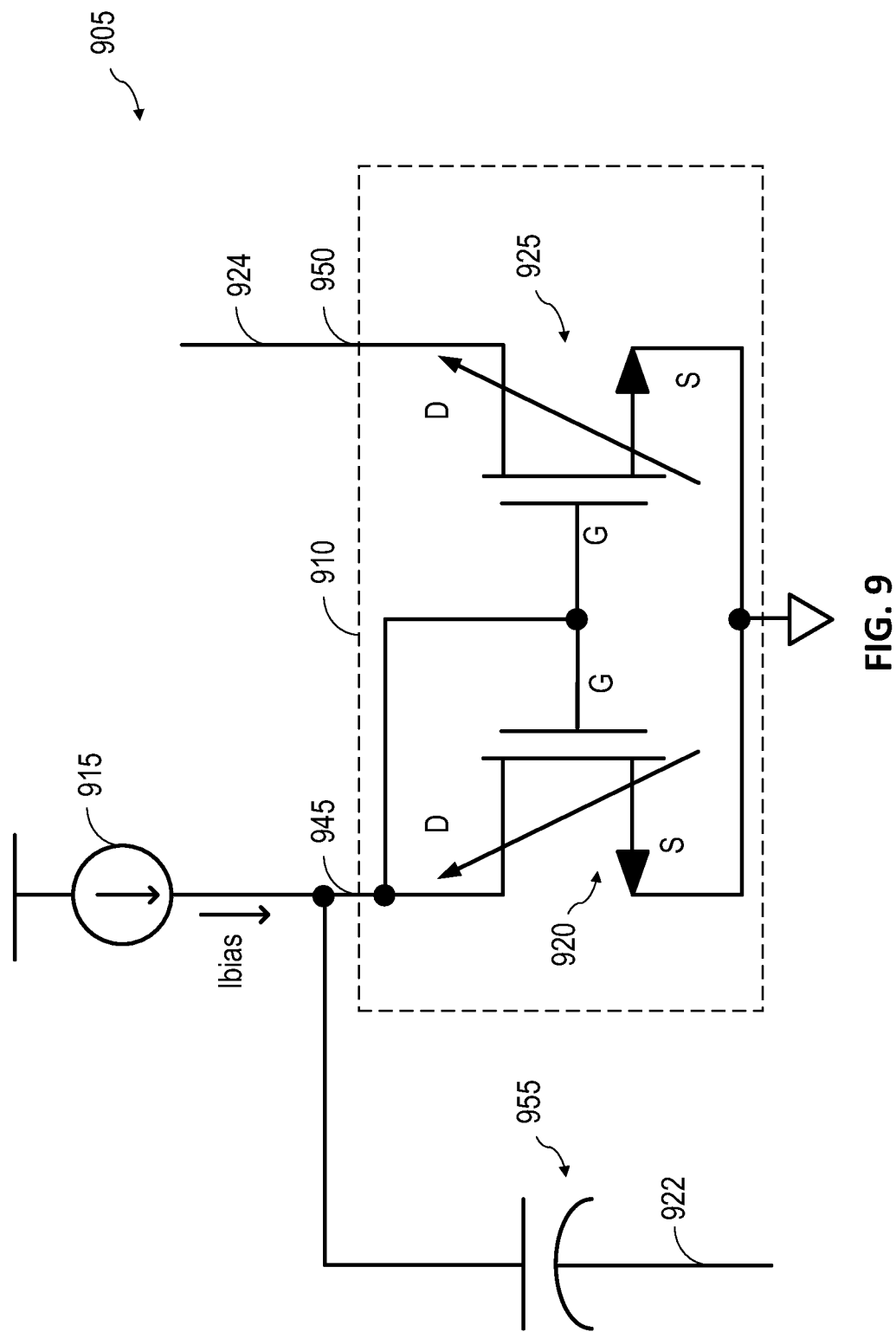
FIG. 9 shows an exemplary implementation of a current amplifier according to certain aspects of the present disclosure.

As discussed above, each of the first amplifiers 720-1 to 720-n may be implemented with a current amplifier. In this regard, FIG. 9 shows an exemplary implementation of a current amplifier 905 according to certain aspects of the present disclosure. Each of the first amplifiers 720-1 to 720-n may be implemented with the current amplifier 905 shown in FIG. 9 (i.e., each of first amplifiers 720-1 to 720-n may be a separate instance of the current amplifier 905 shown in FIG. 9).

The current amplifier 905 has an input 922 coupled to the respective one of the inputs 712-1 to 712-n of the combiner 710 (shown in FIG. 7) and an output 924 coupled to the respective one of the transmission lines 725-1 to 725-n (shown in FIG. 7). The current amplifier 905 includes a current mirror 910, a current source 915, and an alternating current (AC) coupling capacitor 955. The current mirror 910 has an input 945 and an output 950. The AC coupling capacitor 955 is coupled between the input 922 of the current amplifier 905 and the input 945 of the current mirror 910. The output 950 of the current mirror 910 is coupled to the output 924 of the current amplifier 905.

In operation, the AC coupling capacitor 955 AC couples the input current at the input 922 of the current amplifier 905 to the input 945 of the current mirror 910. The current mirror 910 amplifies the input current to generate an output current at the output 924 of the current amplifier 905. Since the output 924 of the current amplifier 905 is coupled to the respective one of the transmission lines 725-1 to 725-n (shown in FIG. 7), the current amplifier 905 drives the respective one of the transmission lines 725-1 to 725-n with the output current.

In the example in FIG. 9, the current mirror 910 includes an input transistor 920 (e.g., NFET) and an output transistor 925 (e.g., NFET). The drain of the input transistor 920 is coupled to the input 945 of the current mirror 910, the source of the input transistor 920 is coupled to ground, and the gate of the input transistor 920 is tied to the drain of the input transistor 920. The drain of the output transistor 925 is coupled to the output 950 of the current mirror 910, the gate of the output transistor 925 is coupled to the gate of the input transistor 920, and the source of the output transistor 925 is coupled to ground. In operation, the current mirror 910 generate an output current at the output 950 of the current mirror 910 that is approximately equal to the current at the input 945 of the current mirror 910 multiplied by a current-mirror ratio. The current-mirror ratio of the current mirror 910 is given by:

$$\text{current\_mirror\_ratio} = \frac{\text{Channel\_Width}_{out}/\text{Gate\_Length}_{out}}{\text{Channel\_Width}_{in}/\text{Gate\_Length}_{in}} \quad \text{(Eq. 4)}$$

where current_mirror_ratio is the current-mirror ratio of the current mirror 910, Channel_Width$_{out}$ is the channel width of the output transistor 925, Gate_Length$_{out}$ is the gate length of the output transistor 925, Channel_Width$_{in}$ is the channel width of the input transistor 920, and Gate_Length$_{in}$ is the gate length of the input transistor 920. In this example, the current gain of the current amplifier 905 is approximately equal to the current-mirror ratio of the current mirror 910. Thus, in this example, the current gain of the current amplifier 905 is given by:

$$\text{current\_gain} = \quad \text{(Eq. 5)}$$
$$\text{current\_mirror\_ratio} = \frac{\text{Channel\_Width}_{out}/\text{Gate\_Length}_{out}}{\text{Channel\_Width}_{in}/\text{Gate\_Length}_{in}}$$

where current_gain is the current gain of the current amplifier 905. For the case where the gate length of the output transistor 925 is approximately equal to the gate length of the input transistor 920, equation 5 may be simplified to the following:

$$\text{current\_gain} = \text{current\_mirror\_ratio} = \frac{\text{Channel\_Width}_{out}}{\text{Channel\_Width}_{in}}. \quad \text{(Eq. 6)}$$

The current amplifier 905 also includes a current source 915 coupled to the input 945 of the current mirror 910. The current source 915 may be a direct current (DC) current source. The current source 915 is configured to provide a DC bias current (labeled "Ibias") to the input 945 of the current mirror 910 for biasing the current mirror 910. The current mirror 910 generate a bias current at the output 950 of the current mirror 910 that is approximately equal to the bias current at the input 945 of the current mirror 910 multiplied by the current-mirror ratio. The bias current at the output 950 provides current biasing for the respective one of the second amplifiers 730-1 to 730-n (shown in FIG. 7). The current source 915 may be implemented with a transistor (e.g., PFET), in which the gate of the transistor is biased based on a reference current to generate the bias current Ibias. Note that the AC coupling capacitor 955 blocks the DC bias current Ibias from the input 922 of the current amplifier 905. The AC coupling capacitor 955 also blocks any DC current at the input 922 from entering the current amplifier 905. In this sense, the AC coupling capacitor 955 may also be referred to as a DC blocking capacitor.

Thus, the current amplifier 905 is configured to receive an input current at the input 922 of the current amplifier 905, and amplify the input current by the current gain of the current amplifier 905 to generate an output current at the output 950 of the current amplifier 905. For the example in which the input 922 is coupled to the output of the respective one of the receiver elements 815-1 to 815-n, the input current may come from the output of the respective one of the receiver elements 815-1 to 815-n. If the respective one of the receiver elements 815-1 to 815-n outputs a voltage, then the output of the respective one of the receiver elements 815-1 to 815-n may be coupled to the input 922 of the current amplifier 905 via a transconductance amplifier (not shown) configured to convert the voltage at the output of the respective receiver element into the input current.

In the example in FIG. 9, the input 945 of the current mirror 910 has a low input impedance. This is because the input transistor 920 is diode-connected, which produces a low input impedance approximately equal to 1/gm, where gm is the transconductance of the input transistor 920. The low input impedance of the current mirror 910 helps ensure that current input to the current amplifier 905 flows through the input 945 of the current mirror 910. Note that the current source 915 has a much higher impedance than the input 945 of the current mirror 910. As a result, very little of the current input to the current amplifier 905 flows into the current source 915.

In the example in FIG. 9, the output 950 of the current mirror 910 has a high output impedance. This is because the impedance looking into the drain of the output transistor 925 is high. The high output impedance allows the current amplifier 905 to efficiently drive the respective transmission line with the output current.

In certain aspects, the channel width of the input transistor 920 is electronically adjustable and the channel width of the output transistor 925 is electronically adjustable. This is indicated by the arrows through the input transistor 920 and the output transistor 925 in FIG. 9. In these aspects, the current gain of the current amplifier 905 can be adjusted by adjusting the channel width of the input transistor 920 and/or adjusting the channel width of the output transistor 925 to achieve a desired current gain (e.g., based on equation (5)).

Figure 10:
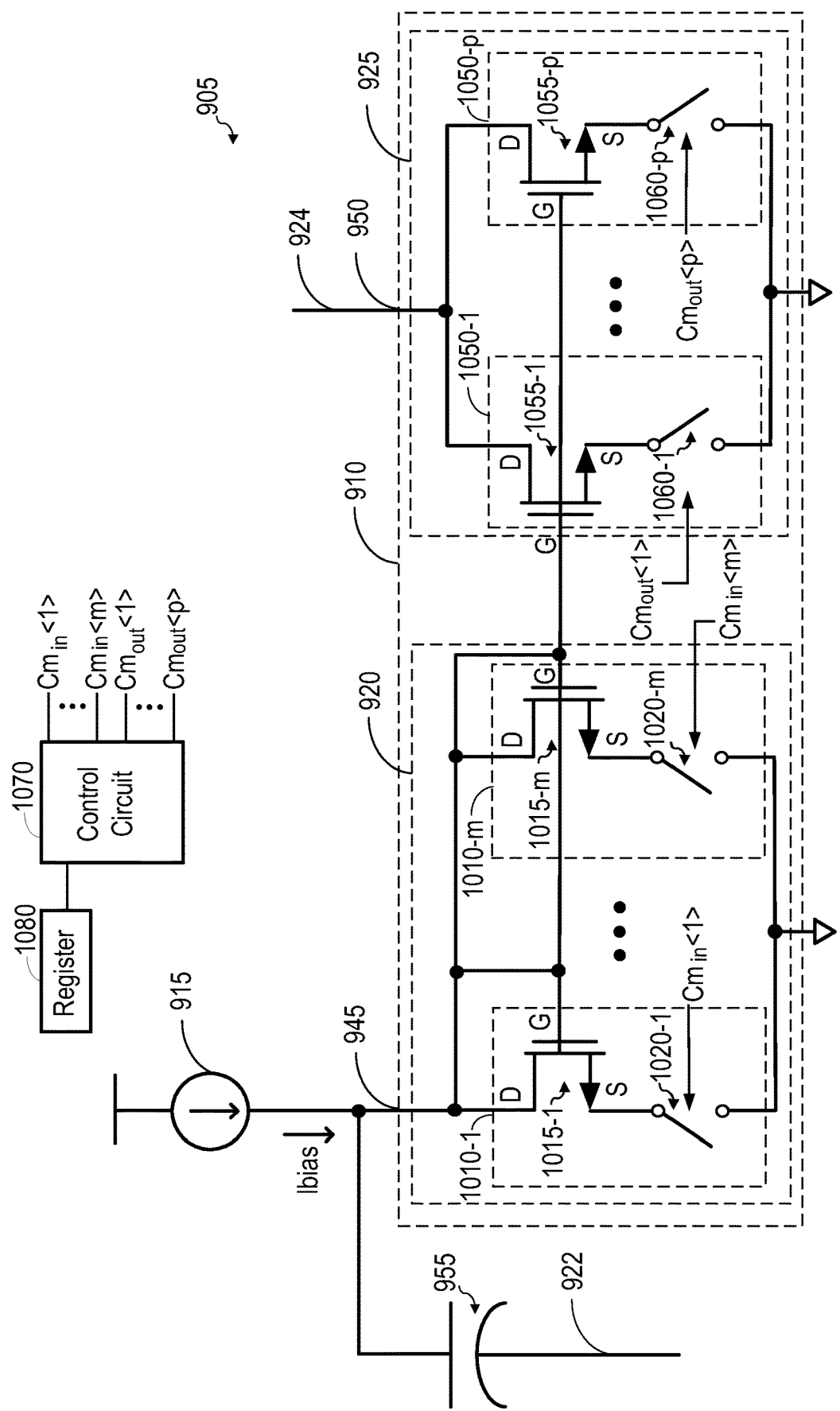
FIG. 10 shows an exemplary implementation of a current amplifier with an adjustable current gain according to certain aspects of the present disclosure.

FIG. 10 shows an exemplary implementation of the input transistor 920 and the output transistor 925, in which the channel width of the input transistor 920 is electronically adjustable and the channel width of the output transistor 925 is electronically adjustable. In this example, the channel width of the input transistor 920 is controlled by a respective multi-bit control signal Cm$_{in}$ and the channel width of the output transistor 925 is controlled by a respective multi-bit control signal Cm$_{out}$. The control signals Cm$_{in}$ and Cm$_{out}$ are generated and output by a control circuit 1070, as discussed further below.

In this example, the input transistor 920 includes multiple parallel branches 1010-1 to 1010-m, in which each of the branches 1010-1 to 1010-m is coupled between the input 945 of the current mirror 910 and ground. Each of the branches 1010-1 to 1010-m includes a respective transistor 1015-1 to 1015-m (e.g., NFET) and a respective switch 1020-1 to 1020-m coupled in series. The gates of the transistors 1015-1 to 1015-m are coupled to the input 945 of the current mirror 910. Note that "m" in FIG. 10 (which indicates the number of branches 1010-1 to 1010-m in the input transistor 920) is not necessarily equal to "m" in FIG. 6 (which indicates the number of receiver elements 645-1 to 645-m in the HB receiver 640).

In this example, the respective multi-bit control signal Cm$_{in}$ includes m control bits Cm$_{in}$<1> to Cm$_{in}$<m> where each of the control bits corresponds to a respective one of the branches 1010-1 to 1010-m. Each of the control bits controls whether the switch 1020-1 to 1020-m of the respective branch 1010-1 to 1010-m is turned on (i.e., closed) or turned off (i.e., open). When a switch 1020-1 to 1020-m is turned on (i.e., closed), the respective branch 1010-1 to 1010-m is enabled, in which case the channel width of the respective transistor 1015-1 to 1015-m contributes to the channel width of the input transistor 920. When a switch 1020-1 to 1020-$m$ is turned off (i.e., open), the respective branch 1010-1 to 1010-$m$ is disabled, in which case the channel width of the respective transistor 1015-1 to 1015-$m$ does not contribute to the channel width of input transistor 920. In this example, the channel width of the input transistor 920 is the aggregate of the channel widths of the transistors 1015-1 to 1015-$m$ in the enabled branches 1010-1 to 1010-$m$. Thus, in this example, the multi-bit control signal $Cm_{in}$ controls the channel width of the input transistor 920 by controlling the number of branches 1010-1 to 1010-$m$ that are enabled. The larger the number of branches 1010-1 to 1010-$m$ that are enabled, the wider the channel width.

The output transistor 925 includes multiple parallel branches 1050-1 to 1050-$p$, in which each of the branches 1050-1 to 1050-$p$ is coupled between the output 950 of the current mirror 910 and ground. Each of the branches 1050-1 to 1050-$p$ includes a respective transistor 1055-1 to 1055-$p$ (e.g., NFET) and a respective switch 1060-1 to 1060-$p$ coupled in series. The gates of the transistors 1055-1 to 1055-$p$ are coupled to the gates of the transistors 1015-1 to 1015-$m$.

In this example, the respective multi-bit control signal $Cm_{out}$ includes p control bits $Cm_{out}<1>$ to $Cm_{out}<p>$ where each of the control bits corresponds to a respective one of the branches 1050-1 to 1050-$p$. Each of the control bits controls whether the switch 1060-1 to 1060-$p$ of the respective branch 1050-1 to 1050-$p$ is turned on (i.e., closed) or turned off (i.e., open). When a switch 1060-1 to 1060-$p$ is turned on (i.e., closed), the respective branch 1050-1 to 1050-$p$ is enabled, in which case the channel width of the respective transistor 1055-1 to 1055-$p$ contributes to the channel width of the output transistor 925. When a switch 1060-1 to 1060-$p$ is turned off (i.e., open), the respective branch 1050-1 to 1050-$p$ is disabled, in which case the channel width of the respective transistor 1055-1 to 1055-$p$ does not contribute to the channel width of output transistor 925. In this example, the channel width of the output transistor 925 is the aggregate of the channel widths of the transistors 1055-1 to 1055-$p$ in the enabled branches 1050-1 to 1050-$p$. Thus, in this example, the multi-bit control signal $Cm_{out}$ controls the channel width of the output transistor 925 by controlling the number of branches 1050-1 to 1050-$p$ that are enabled. The larger the number of branches 1050-1 to 1050-$p$ that are enabled, the wider the channel width.

Thus, in this example, the control circuit 1070 is able to set the channel width of the input transistor 920 using the control signal $Cm_{in}$ and set the channel width of the output transistor 925 using the control signal $Cm_{out}$. This allows the control circuit 1070 to set the current-mirror ratio of the current mirror 910 (e.g., based on equation (4)), and hence set the current gain of the current amplifier 905 (e.g., based on equation (5)). Note that, for ease of illustration, the individual connections between the control circuit 1070 and the switches 1020-1 to 1020-$m$ and 1060-1 to 1060-$p$ are not shown in FIG. 10.

In one example, the control circuit 1070 sets the current gain of the current amplifier 905 according to a current gain value stored in a register 1080. In this example, the current gain value indicates a current gain for the current amplifier 905. To set the current gain, the control circuit 1070 sets the current-mirror ratio of the current mirror 910 to a current-mirror ratio corresponding to the current gain indicated by the current gain value (e.g., based on equation (5)). The control circuit 1070 sets the current-mirror ratio of the current mirror by setting the channel width of the input transistor 920 using the control signal $Cm_{in}$ and setting the channel width of the output transistor 925 using the control signal $Cm_{out}$ accordingly (e.g., based on equation (4)). In this example, the current gain of the current amplifier 905 may be programmed by programming (e.g., writing) the current gain value stored in the register 1080.

In the example in FIG. 10, both the input transistor 920 and the output transistor 925 have adjustable channel widths. However, it is to be appreciated that the present disclosure is not limited to this example. For example, the channel width of the input transistor 920 may be fixed while the channel width of the output transistor 925 is adjustable. In this example, the control circuit 1070 may adjust the current-mirror ratio of the current mirror 910 (and hence adjust the current gain of the current amplifier 905) by adjusting the channel width of the output transistor 925 using the control signal $Cm_{out}$. In another example, the channel width of the output transistor 925 may be fixed while the channel width of the input transistor 920 is adjustable. In this example, the control circuit 1070 may adjust the current-mirror ratio of the current mirror 910 (and hence adjust the current gain of the current amplifier 905) by adjusting the channel width of the input transistor 920 using the control signal $Cm_{in}$.

Figure 11:
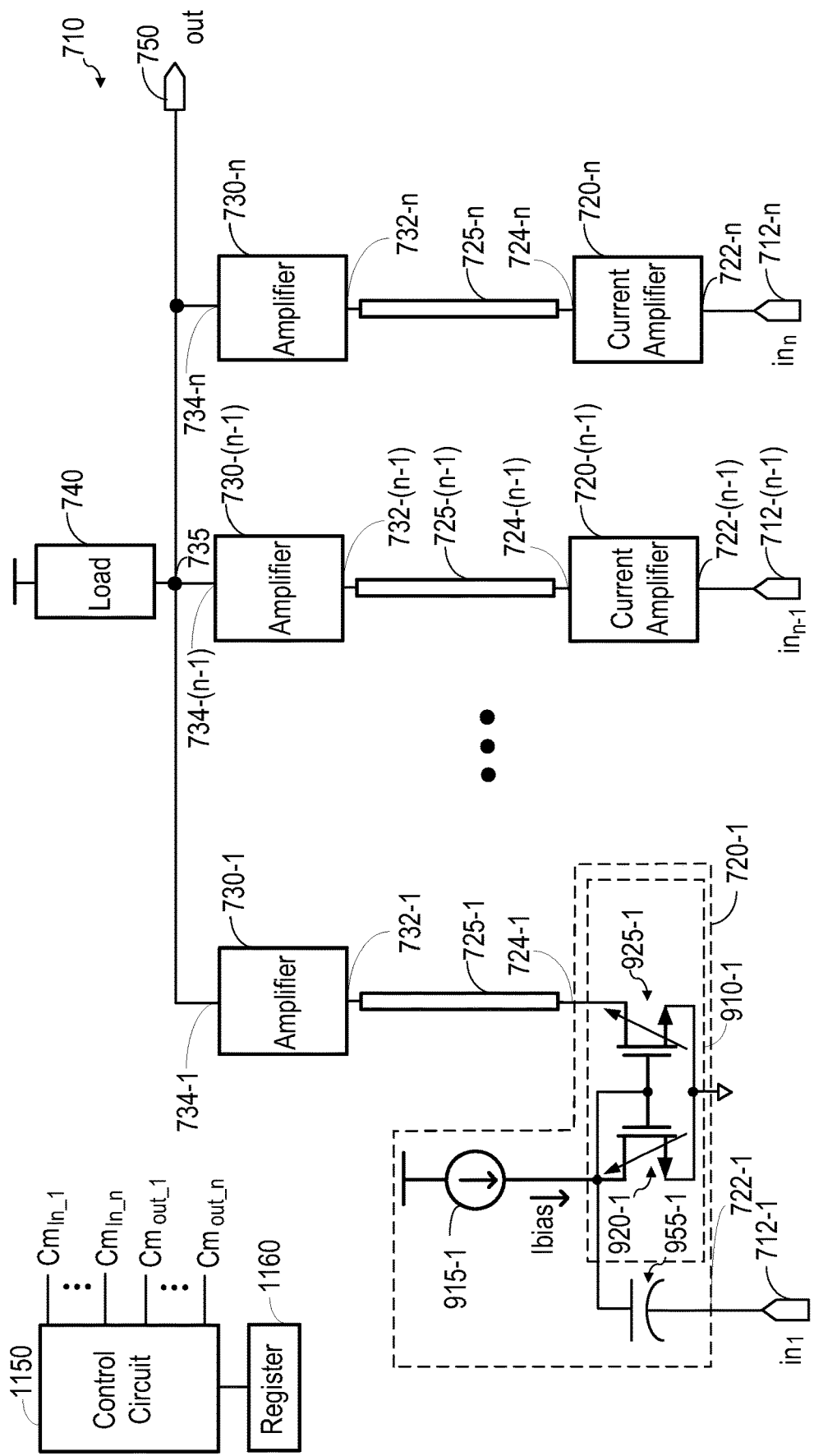
FIG. 11 shows an example of a combiner including current amplifiers according to certain aspects of the present disclosure.

FIG. 11 shows an example in which each of the first amplifiers 720-1 to 720-$n$ is implemented with the exemplary current amplifier 905 shown in FIG. 10 (i.e., each of the first amplifiers 720-1 to 720-$n$ is a separate instance of the current amplifier 905 shown in FIG. 10). For ease of illustration, details are only shown for one of the first amplifiers 720-1 to 720-$n$ (i.e., first amplifier 720-1) in FIG. 11. In this example, each of the first amplifiers 720-1 to 720-$n$ receives a respective input current from the respective input 712-1 to 712-$n$ of the combiner 710, and amplifies the respective input current by a respective current gain to generate a respective output current. Each of the first amplifiers 720-1 to 720-$n$ drives the respective transmission line 725-1 to 725-$n$ with the respective output current.

In one example, the current gains of the first amplifiers 720-1 to 720-$n$ may be independently controlled. In this example, a control circuit 1150 may independently set the current gain of each of the first amplifiers 720-1 to 720-$n$. For each of the first amplifiers 720-1 to 720-$n$, the control circuit 1150 outputs a respective control signal for setting the channel width of the respective input transistor (labeled "$Cm_{in\_1}$" to "$Cm_{in\_n}$") and a respective control signal for setting the channel width of the respective output transistor (labeled "$Cm_{out\_1}$" to "$Cm_{out\_n}$"). For each of the first amplifiers 720-1 to 720-$n$, the control circuit 1070 uses the respective one of the control signals $Cm_{in\_1}$ to $Cm_{in\_n}$ and the respective one of the control signals $Cm_{out\_1}$ to $Cm_{out\_n}$ to set the current gain of the amplifier, as discussed further below. For ease of illustration, the individual connections between the control circuit 1150 and the first amplifiers 720-1 to 720-$n$ are not shown in FIG. 11.

In this example, a register 1160 may store multiple current gain values, in which each of the current gain values indicates a current gain for a respective one of the first amplifiers 720-1 to 720-$n$. As used herein, a "register" may be implemented with multiple registers for storing multiple values. The control circuit 1150 sets the current gain of each of the first amplifiers 720-1 to 720-$n$ to the current gain indicated by the respective current gain value in the register 1160. More particularly, for each of the first amplifiers 720-1 to 720-$n$, the control circuit 1150 sets the channel width of the respective input transistor using the respective one of the control signals $Cm_{in\_1}$ to $Cm_{in\_n}$ and sets the channel width of the respective output transistor using the respective one of the control signals $Cm_{out\_1}$ to $Cm_{out\_n}$ to set the current-mirror ratio of the respective current mirror to a current-mirror ratio corresponding to the current gain indicated by the respective current gain value (e.g., based on equation (5)). In this example, the current gains of the first amplifiers 720-1 to 720-n may be programmed by programming (e.g., writing) the current gain values stored in the register 1160.

Thus, the first amplifiers 720-1 to 720-n may be implemented with current amplifiers having programmable current gains. The current gains of the first amplifiers 720-1 to 720-n may be programed, for example, so that the amplitudes of the currents at the inputs 732-1 to 732-n of the second amplifiers 730-1 to 730-n are approximately the same. This helps ensure that the signals being combined at the combining node 735 have approximately the same amplitude, which may help narrow the beam pattern of the phased-array receiver. The narrower beam pattern increases the directivity of the phased-array receiver.

In one example, the lengths of the transmission lines 725-1 to 725-n may vary due to the layout of the first amplifiers 720-1 to 720-n and the second amplifiers 730-1 to 730-n. In this example, the length of one of the transmission lines 725-1 to 725-n may be at least 20 percent longer than the length of another one of the transmission lines 725-1 to 725-n. The variation in the lengths of the transmission lines 725-1 to 725-n may cause variation in signal losses in the transmission lines 725-1 to 725-n. The variation in signal losses in the transmission lines 725 to 725-n may lead to variation in the amplitudes of the currents at the inputs 732- to 732-n of the second amplifiers 730-1 to 730-n. To correct for this, the current gains of the first amplifiers 720-1 to 720-n may be programmed to compensate for the variation in signal losses in the transmission lines 725-1 to 725-n. For example, if a transmission line coupled to a first one of the first amplifiers 720-1 to 720-n experiences higher signal loss than a transmission line coupled to a second one of the first amplifiers 720-1 to 720-n, then the current gain of the first one of the first amplifiers 720-1 to 720-n may be programmed to be higher than the current gain of the second one of the first amplifiers 720-1 to 720-n to compensate for the higher signal loss. In this example, the register 1150 may store different current gain values for the first one of the first amplifiers 720-1 to 720-n and the second one of the first amplifiers 720-1 to 720-n. It is to be appreciated that the current gains of the first amplifiers 720-1 to 720-n may also be programed based on other factors, examples of which are discussed below.

In the above example, the variation in the lengths of the transmission lines 725-1 to 725-n may also cause phase offsets between the currents at the inputs 732-1 to 732-n of the second amplifiers 730-1 to 730-n. To correct for this, the phase shifts of the phase shifters (e.g., 325-1 to 325-n, 424-1 to 424-n, 522-1 to 522-n, 625-1 to 625-n, or 655-1 to 655-m) in the receiver elements 815-1 to 815-n may include phase shift components that compensate for the phase offsets due to variation in the lengths of the transmission lines 725-1 to 725-n. Thus, in this example, the phase shift of each phase shifter may include a phase shift component to set the receive direction of the phased antenna array (e.g., based on equation (3)) and a phase shift component to compensate for the phase offsets due to variation in the lengths of the transmission lines 725-1 to 725-n. This helps ensure that the currents at the inputs 732-1 to 732-n of the second amplifiers 730-1 to 730-n are aligned in phase for constructive combining at the combining node 735.

Figure 12:
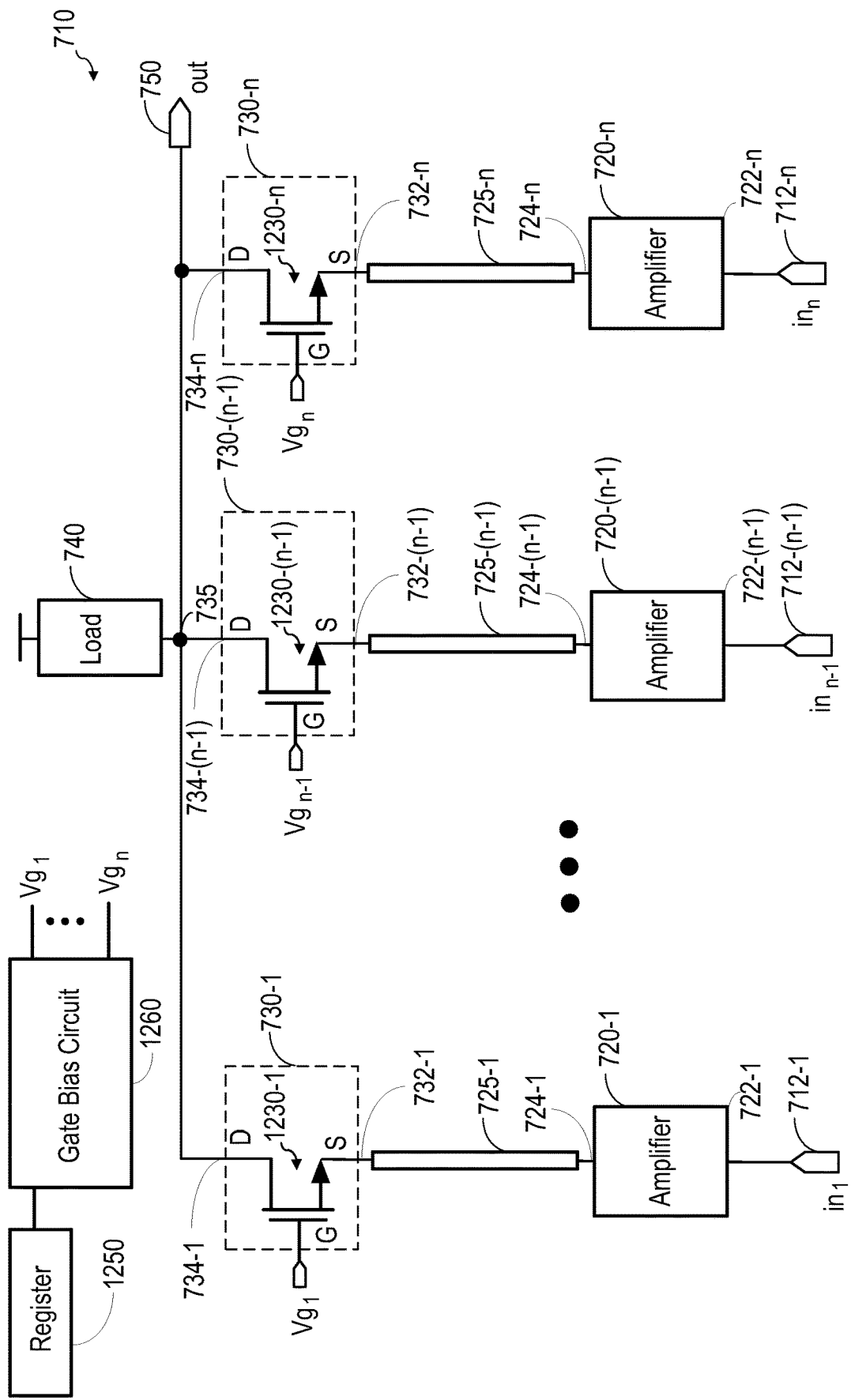
FIG. 12 shows an example of a combiner including common gate amplifiers according to certain aspects of the present disclosure.

FIG. 12 shows an example in which each of the second amplifiers 730-1 to 730-n is implemented with a common gate amplifier including a respective transistor 1230-1 to 1230-n having a drain (labeled "D") coupled to the combining node 735, a gate (labeled "G") biased by a respective bias voltage $Vg_1$ to $Vg_n$, and a source (labeled "S") coupled to the respective transmission line 725-1 to 725-n. In this example, the output 734-1 to 734-n of each of the second amplifiers 730-1 to 730-n is located at the drain of the respective transistor 1230-1 to 1230-n, and the input 732-1 to 732-n of each of the second amplifiers 730-1 to 730-n is located at the source of the respective transistor 1230-1 to 1230-n. In the example in FIG. 12, each of the transistors 1230-1 to 1230-n is an n-type field effect transistor (NFET). However, it is to be appreciated that the transistors 1230-1 to 1230-n may be implemented with other types of transistors (e.g., a p-type field effect transistors (PFETs)).

An advantage of implementing each of the second amplifiers 730-1 to 730-n with a common gate amplifier is that a common gate amplifier can be small. This allows the second amplifiers 730-1 to 730-n to be placed close to each other. The close proximity of the second amplifiers 730-1 to 730-n reduces signal losses between the outputs 734-1 to 734-n of the second amplifiers 730-1 to 730-n and the combining node 735, which improves the quality of the signal combining at the combining node 735.

In the example in FIG. 12, each of the second amplifiers 730-1 to 730-n has a low input impedance approximately equal to 1/gm, where gm is the transconductance of the respective transistor 1230-1 to 1230-n. The low input impedance of each of the second amplifiers 730-1 to 730-n may be approximately matched to the characteristic impedance (e.g., 40 to 50 ohms) of the respective transmission line 725-1 to 725-n to provide good impedance matching between the input of the second amplifier and the respective transmission line 725-1 to 725-n, as discussed further below.

In the example in FIG. 12, the input impedance of each of the second amplifiers 730-1 to 730-n is a function of the respective gate bias voltage $Vg_1$ to $Vg_n$ (i.e., the gate bias voltage $Vg_1$ to $Vg_n$ applied to the gate of the respective transistor 1230-1 to 1230-n). For example, the input impedance of each of the second amplifiers 730-1 to 730-n may be approximately inversely proportional to the respective gate bias voltage $Vg_1$ to $Vg_n$. This is because the input impedance of each of the second amplifiers 730-1 to 730-1 is approximately equal to 1/gm of the respective transistor 1230-1 to 1230-1, and the gm of the respective transistor 1230-1 to 1230-n is approximately proportional to the respective gate bias voltage $Vg_1$ to $Vg_n$ in the saturation region. Thus, the input impedance of each of the second amplifiers 730-1 to 730-n can be adjusted (i.e., tuned) by adjusting the respective gate bias voltage, as discussed further below.

In one example, the gate bias voltage $Vg_1$ to $Vg_n$ of each of the second amplifiers 730-1 to 730-n may be set such that the input impedance of the second amplifier approximately matches the characteristic impendence of the respective transmission line 725-1 to 725-n. The good impedance matching between the input of each of the second amplifiers 730-1 to 730-n and the respective transmission line increases power transfer between the transmission lines 725-1 to 725-n and the inputs 732-1 to 732-n of the second amplifiers 730-1 to 730-n.

In one example, a gate bias circuit 1260 generates and outputs the gate bias voltages $Vg_1$ to $Vg_n$ for the second amplifiers 730-1 to 730-n. For ease of illustration, the individual connections between the gate bias circuit 1260 and the second amplifiers 730-1 to 730-n are not explicitly shown in FIG. 12.

In this example, multiple gate bias voltage values are stored in a register 1250 coupled to the gate bias circuit 1260, in which each of the gate bias voltage values indicates the gate bias voltage for a respective one of the second amplifiers 730-1 to 730-*n* (i.e., indicates a respective one of $Vg_1$ to $Vg_n$). As discussed above, a "register" may be implemented with multiple registers for storing multiple values. In this example, the gate bias circuit 1260 retrieves the gate bias voltage value for each of the second amplifiers 730-1 to 730-*n* from the register 1250, and sets the gate bias voltage for each of the second amplifiers 730-1 to 730-*n* based on the respective gate bias voltage value. The gate bias circuit 1260 may independently set the gate bias voltage for each of the second amplifiers 730-1 to 730-*n* based on the respective gate bias voltage value. The gate bias voltage for each of the second amplifiers 730-1 to 730-*n* may be programmed by programming (e.g., writing) the corresponding gate bias voltage value stored in the register 1250.

In the above example, each of the gate bias voltage values in the register 1250 may indicate a gate bias voltage that causes the input impedance of the respective one of the second amplifiers 730-1 to 730-*n* to approximately match the characteristic impedance of the respective transmission line 725-1 to 725-*n* for good impedance matching. Gate bias voltages that provide good impedance matching between the inputs 732-1 to 732-*n* of the second amplifiers 730-1 to 730-*n* and the transmission lines 725-1 to 725-*n* may be determined based on computer simulations of the combiner 710 and/or tests performed on the combiner 710.

Figure 13:
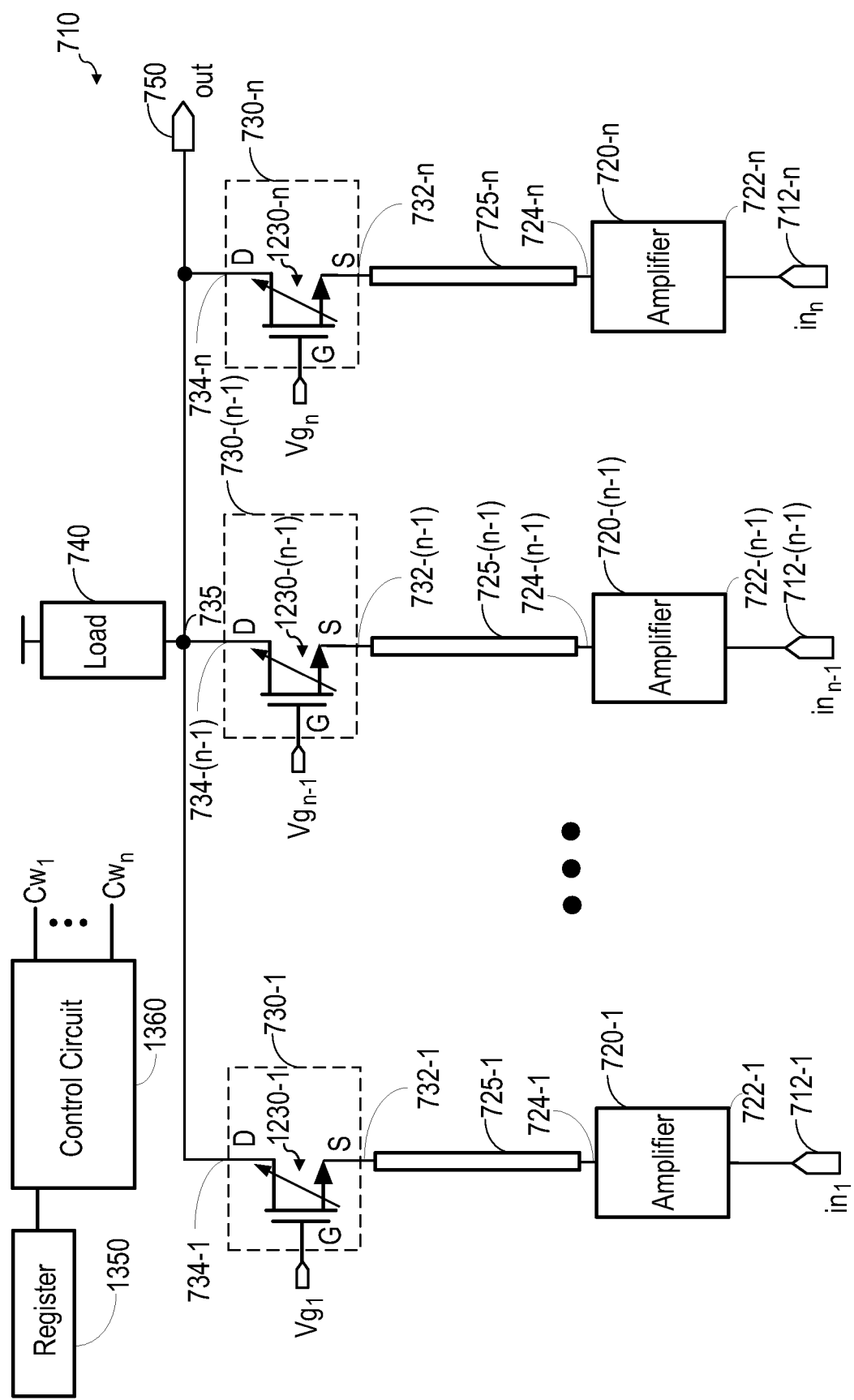
FIG. 13 shows an example of a combiner including common gate amplifiers with adjustable channel widths according to certain aspects of the present disclosure.

In certain aspects, each of one or more of the second amplifiers 730-1 to 730-*n* has an electronically adjustable channel width. An example of this is illustrated in FIG. 13, in which the arrow through each of the second amplifiers 730-1 to 730-*n* indicates that the channel width of the second amplifier 730-1 to 730-*n* is adjustable. In the example shown in FIG. 13, all of the second amplifiers 730-1 to 730-*n* have an adjustable channel width, although it is to be appreciated that this need not be the case In this example, the input impedance of each of the second amplifiers 730-1 to 730-*n* is a function of the respective channel width. The larger the channel width, the larger the transconductance gm (and hence the smaller the input impedance which is approximately equal to 1/gm). Thus, the input impedance of each of the second amplifiers 730-1 to 730-*n* may be adjusted (i.e., tuned) by adjusting the respective channel width. In one example, the channel width of each of the second amplifiers 730-1 to 730-*n* may be set such that the input impedance of the second amplifier approximately matches the characteristic impendence of the respective transmission line 725-1 to 725-*n*, as discussed further below.

In one example, the channel width of each of the second amplifiers 730-1 to 730-*n* is controlled by a respective control signal $Cw_1$ to $Cw_n$. In this example, a control circuit 1360 generates and outputs the control signals $Cw_1$ to $Cw_n$ to the second amplifiers 730-1 to 730-*n*, and sets the channel width of each of the second amplifiers 730-1 to 730-*n* using the respective control signal $Cw_1$ to $Cw_n$. For ease of illustration, the individual connections between the control circuit 1360 and the second amplifiers 730-1 to 730-*n* are not explicitly shown in FIG. 13.

In this example, multiple channel width values are stored in a register 1350 coupled to the control circuit 1360, in which each of the channel width values indicates the channel width for a respective one of the second amplifiers 730-1 to 730-*n*. As discussed above, a "register" may be implemented with multiple registers for storing multiple values. In this example, the control circuit 1360 retrieves the channel width value for each of the second amplifiers 730-1 to 730-*n* from the register 1350, and sets the channel width for each of the second amplifiers 730-1 to 730-*n* based on the respective channel width value using the respective channel width control signal. The control circuit 1360 may independently set the channel width of each of the second amplifiers 730-1 to 730-*n* based on the respective channel width value. The channel width for each of the second amplifiers 730-1 to 730-*n* may be programmed by programming (e.g., writing) the corresponding channel width value stored in the register 1350.

In the above example, each of the channel width values in the register 1350 may indicate a channel width that causes the input impedance of the respective one of the second amplifiers 730-1 to 730-*n* to approximately match the characteristic impedance of the respective transmission line 725-1 to 725-*n* for good impedance matching. Channel widths that provide good impedance matching between the inputs 732-1 to 732-*n* of the second amplifiers 730-1 to 730-*n* and the transmission lines 725-1 to 725-*n* may be determined based on computer simulations of the combiner 710 and/or tests performed on the combiner 710.

Figure 14A:
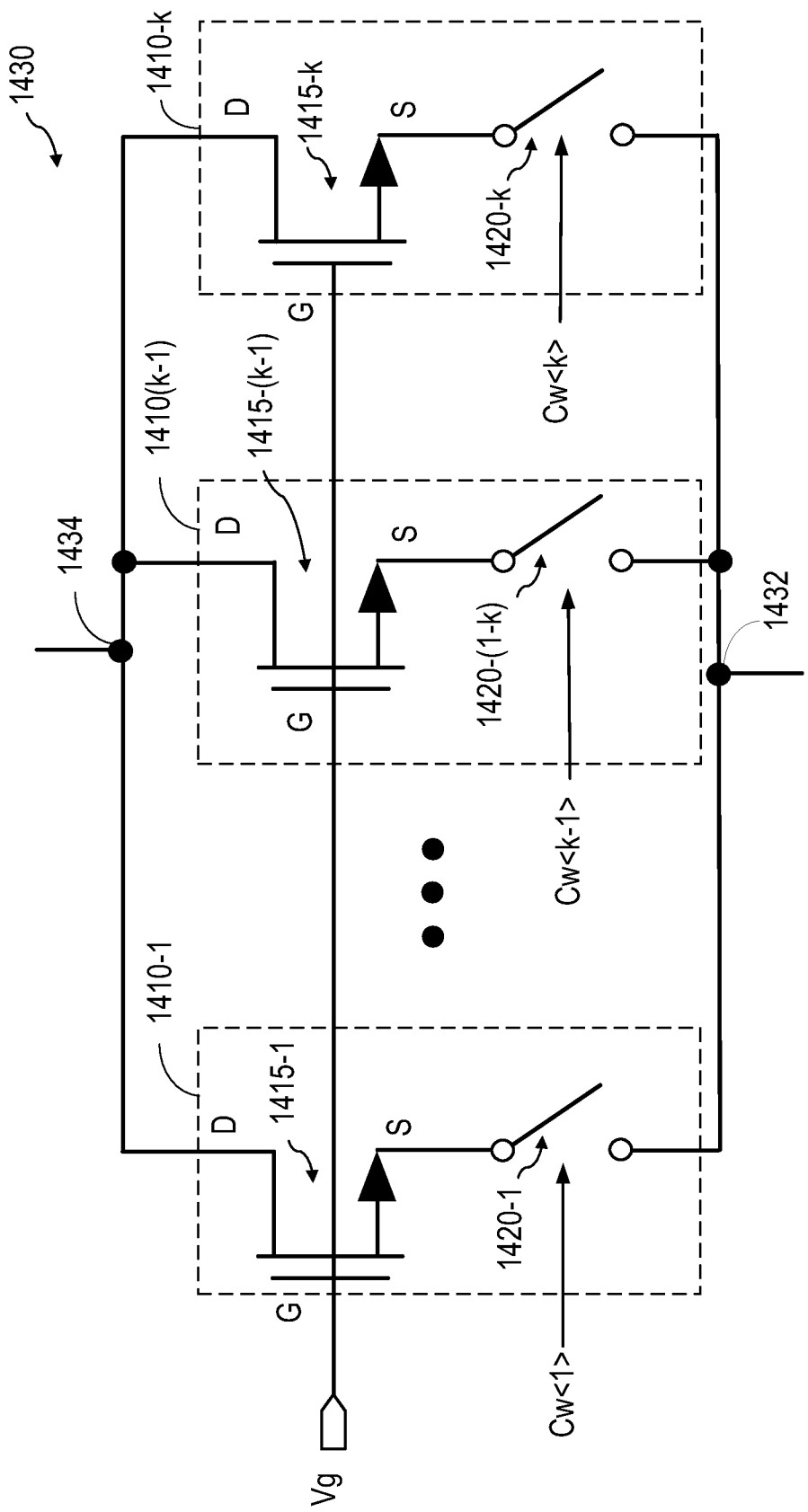
FIG. 14A shows an exemplary implementation of a common gate amplifier with an adjustable channel width according to certain aspects of the present disclosure.

FIG. 14A shows an exemplary implementation of a common gate amplifier 1430, in which the common gate amplifier 1430 has an electronically adjustable channel width that is controlled by the respective control signal (e.g., respective one of the control signals $Cw_1$ to $Cw_n$). Each of the second amplifiers 730-1 to 730-*n* shown in FIG. 13 may be implemented with the common gate amplifier 1430 shown in FIG. 14A (i.e., each of the second amplifiers 730-1 to 730-*n* may be a separate instance of the common gate amplifier 1430 shown in FIG. 14A).

In the example shown in FIG. 14A, the common gate amplifier 1430 includes multiple parallel branches 1410-1 to 1410-*k*, in which each of the branches 1410-1 to 1410-*k* is coupled between an output 1434 and an input 1432 of the common gate amplifier 1430. The output 1434 is coupled to the combining node 735 (shown in FIG. 13) and the input 1432 is coupled to the respective transmission line 725-1 to 725-*n* (shown in FIG. 13). Each of the branches 1410-1 to 1410-*k* includes a respective transistor 1415-1 to 1415-*k* (e.g., NFET) and a respective switch 1420-1 to 1420-*k* coupled in series. The gates of the transistors 1415-1 to 1415-*k* are biased by the gate bias voltage Vg (e.g., respective one of the gate bias voltages $Vg_1$ to $Vg_n$ in FIG. 13). Note that "k" in FIG. 14A (which indicates the number of branches 1410-1 to 1410-*k*) is not necessarily equal to "k" in FIG. 2 (which indicates the number of antennas 210-1 to 210-*k* in the phased antenna array 205).

In this example, the respective control signal includes k control bits Cw<1> to Cw<k> where each of the control bits corresponds to a respective one of the branches 1410-1 to 1410-*k*. Each of the control bits controls whether the switch 1420-1 to 1420-*k* of the respective branch 1410-1 to 1410-*k* is turned on (i.e., closed) or turned off (i.e., open). When a switch 1420-1 to 1420-*k* is turned on (i.e., closed), the respective branch 1410-1 to 1410-*k* is enabled, in which case the channel width of the respective transistor 1415-1 to 1415-*k* contributes to the channel width of the common gate amplifier 1430. When a switch 1420-1 to 1420-*k* is turned off (i.e., open), the respective branch 1410-1 to 1410-*k* is disabled, in which case the channel width of the respective transistor 1415-1 to 1415-*k* does not contribute to the channel width of the common gate amplifier 1430. In this example, the channel width of the common gate amplifier 1430 is the aggregate of the channel widths of the transistors 1415-1 to 1415-*k* in the enabled branches 1410-1 to 1410-*k*.

Thus, in this example, the respective control signal controls the channel width of the common gate amplifier 1430 by controlling the number of branches 1410-1 to 1410-k that are enabled. The larger the number of branches 1410-1 to 1410-k that are enabled, the wider the channel width. Note that, for the example in which each of the second amplifiers 730-1 to 730-n is implemented with the common gate amplifier 1430 in FIG. 14A, the branches 1410-1 to 1410-k shown in FIG. 14A implement the respective transistor 1230-1 to 1230-n.

Figure 14B:
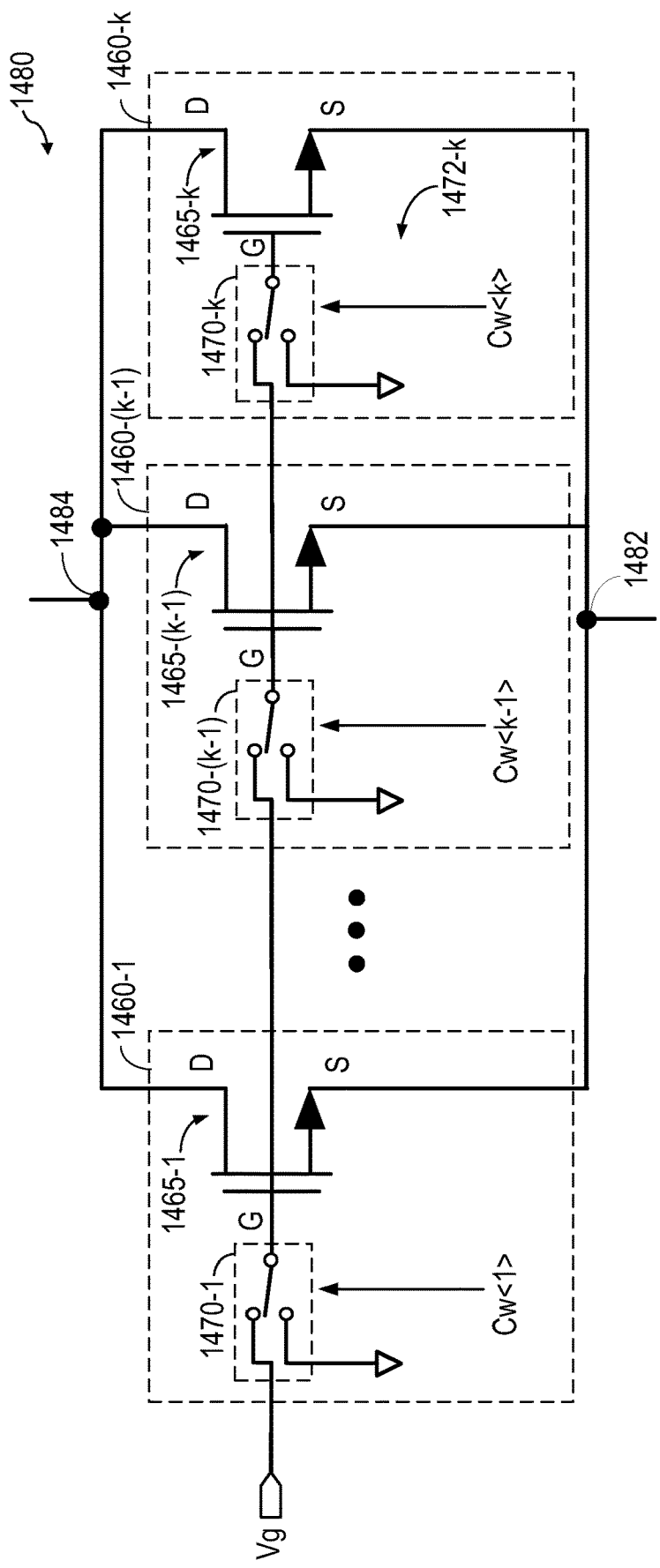
FIG. 14B shows another exemplary implementation of a common gate amplifier with an adjustable channel width according to certain aspects of the present disclosure.

FIG. 14B shows another exemplary implementation of a common gate amplifier 1480, in which the common gate amplifier 1480 has an electronically adjustable channel width that is controlled by the respective control signal (e.g., respective one of the control signals $Cw_1$ to $Cw_n$). Each of the second amplifiers 730-1 to 730-n shown in FIG. 13 may be implemented with the common gate amplifier 1480 shown in FIG. 14B (i.e., each of the second amplifiers 730-1 to 730-n may be a separate instance of the common gate amplifier 1480 shown in FIG. 14B).

In the example shown in FIG. 14B, the common gate amplifier 1480 includes multiple parallel branches 1460-1 to 1460-k, in which each of the branches 1460-1 to 1460-k is coupled between an output 1484 and an input 1482 of the common gate amplifier 1480. The output 1484 is coupled to the combining node 735 (shown in FIG. 13) and the input 1482 is coupled to the respective transmission line 725-1 to 725-n (shown in FIG. 13). Each of the branches 1460-1 to 1460-k includes a respective transistor 1465-1 to 1465-k (e.g., NFET) having a drain coupled to the output 1484 and a source coupled to the input 1482 of the common gate amplifier 1480. Each of the branches 1460-1 to 1460-k also includes a respective switch 1470-1 to 1470-k coupled to the gate of the respective transistor 1465-1 to 1465-k. Each switch 1470-1 to 1470-k is configured to selectively couple the gate of the respective transistor 1465-1 to 1465-k to a gate bias voltage Vg (e.g., the respective one of the gate bias voltages $Vg_1$ to $Vg_n$ in FIG. 13) or ground, as discussed further below. Each switch 1470-1 to 1470-k may be implemented with a single-pole-two-throw (SP2T) switch or another type of switch.

In this example, the respective control signal includes k control bits Cw<1> to Cw<k> where each of the control bits corresponds to a respective one of the branches 1460-1 to 1460-k. Each of the control bits controls whether the switch 1470-1 to 1470-k of the respective branch 1460-1 to 1460-k couples the gate of the respective transistor 1465-1 to 1465-k to the gate bias voltage Vg or ground. In this regard, each of the control bits may set the switch 1470-1 to 1470-k of the respective branch 1460-1 to 1460-k to couple the gate of the respective transistor 1465-1 to 1465-k to the gate bias voltage Vg or ground. In one example, a switch 1460-1 to 1460-k may be configured to couple the gate of the respective transistor 1465-1 to 1465-k to the gate bias voltage Vg when the respective control bit has a first logic value and couple the gate of the respective transistor 1465-1 to 1465-k to ground when the respective control bit has a second logic value.

When a switch 1460-1 to 1460-k couples the gate of the respective transistor 1465-1 to 1465-k to the gate bias voltage Vg, the respective branch 1460-1 to 1460-k is enabled, in which case the gate of the respective transistor 1465-1 to 1465-k is biased by the gate voltage of the common-gate amplifier (e.g., the respective one of the gate bias voltages $Vg_1$ to $Vg_n$ in FIG. 13). When a switch 1470-1 to 1470-k couples the gate of the respective transistor 1465-1 to 1465-k to ground, the respective branch 1460-1 to 1460-k is disabled, in which case the respective transistor 1465-1 to 1465-k is turned off. In this example, the channel width of the common gate amplifier 1480 is the aggregate of the channel widths of the transistors 1465-1 to 1465-k in the enabled branches 1460-1 to 1460-k. Thus, in this example, the respective control signal controls the channel width of the common gate amplifier 1480 by controlling the number of branches 1460-1 to 1460-k that are enabled. The larger the number of branches 1460-1 to 1460-k that are enabled, the wider the channel width. Note that, for the example in which each of the second amplifiers 730-1 to 730-n is implemented with the common gate amplifier 1480 in FIG. 14B, the branches 1460-1 to 1460-k shown in FIG. 14B implement the respective transistor 1230-1 to 1230-n.

Thus, the input impedance of each of the second amplifiers 730-1 to 730-n can be adjusting (i.e., tuned) by adjusting the respective gate bias voltage or the respective channel width. In certain aspects, both the gate bias voltage and the channel width of each of the second amplifiers 730-1 to 730-n may be adjusted (i.e., tuned) to set the respective input impedance. In other words, the gate bias voltage and the channel width of each of the second amplifiers 730-1 to 730-n provide two degrees of freedom for setting the respective input impedance. For each of the second amplifiers 730-1 to 730-n, the respective gate bias voltage value and the respective channel width value may be programmed so that, in combination, the respective gate bias voltage value and the respective channel width value set the respective input impedance to a desired impedance (e.g., an impedance matching the characteristic impedance of the respective transmission line). In operation, the gate bias circuit 1260 sets the gate bias voltages $Vg_1$ to $Vg_n$ of the second amplifiers 730-1 to 730-n based on the respective gate bias voltage values stored in the register 1250, and the control circuit 1360 sets the channel widths of the second amplifiers 730-1 to 730-n based on the respective channel width values stored in the register 1350.

In certain aspects, the characteristic impedances of the transmission lines 725-1 to 725-n may vary. For example, the characteristic impedance of a transmission line may be frequency dependent. In this example, two transmission lines carrying signals in different frequency bands (e.g., HB and LB) may have different characteristic impedances. In another example, the characteristic impedances of the transmission lines 725-1 to 725-n may be different due to process variation and/or differences in the designs of the transmission lines 725-1 to 725-n (i.e., one transmission line may be integrated on a chip while another transmission line is an off-chip transmission line). In these aspects, the input impedance of each of the second amplifiers 730-1 to 730-n may be programmed by setting the respective gate bias voltage and/or setting the respective channel width such that the respective input impedance approximately matches the characteristic impendence of the respective transmission line. Thus, the input impedances of the second amplifiers 730-1 to 730-n may be individually programmed to approximately match the characteristic impedances of the respective transmission lines 725-1 to 725-n.

In one example, a first one of the second amplifiers 730-1 to 730-n is coupled to a first one of the transmission lines 725-1 to 725-n and a second one of the second amplifiers 730-1 to 730-n is coupled to a second one of the transmission lines 725-1 to 725-n, in which the first and second ones of the transmission lines 725-1 to 725-n have different characteristic impedances (e.g., due to any one of the reasons discussed above). In this example, the input impedance of the first one of the second amplifiers 730-1 to 730-n may be programmed to approximately match the characteristic impedance of the first one of the transmission lines 725-1 to 725-*n*, and the input impedance of the second one of the second amplifiers 730-1 to 730-*n* may be programmed to approximately match the characteristic impedance of the second one of the transmission lines 725-1 to 725-*n*. Since the first and second ones of the transmission lines 725-1 to 725-*n* have different characteristic impedances in this example, the first and second ones of the second amplifiers 730-1 to 730-*n* may be programmed to have different input impedances.

In the above example, the first and second ones of the second amplifiers 730-1 to 730-*n* may be programmed to have different input impedances by biasing the first and second ones of the second amplifiers 730-1 to 730-*n* with different gate bias voltages. In this example, the register 1250 may store different gate bias voltage values for the first and second ones of the second amplifiers 730-1 to 730-*n*. In another example, the first and second ones of the second amplifiers 730-1 to 730-*n* may be programmed to have different input impedances by setting the channel widths of the first and second ones of the second amplifiers 730-1 to 730-*n* to different widths. In this example, the register 1360 may store different channel width values for the first and second ones of the second amplifiers 730-1 to 730-*n*. In another example, the first and second ones of the second amplifiers 730-1 to 730-*n* may be programmed to have different input impedances by both biasing the first and second ones of the second amplifiers 730-1 to 730-*n* with different gate bias voltages and setting the channel widths of the first and second ones of the second amplifiers 730-1 to 730-*n* to different widths.

Figure 15:
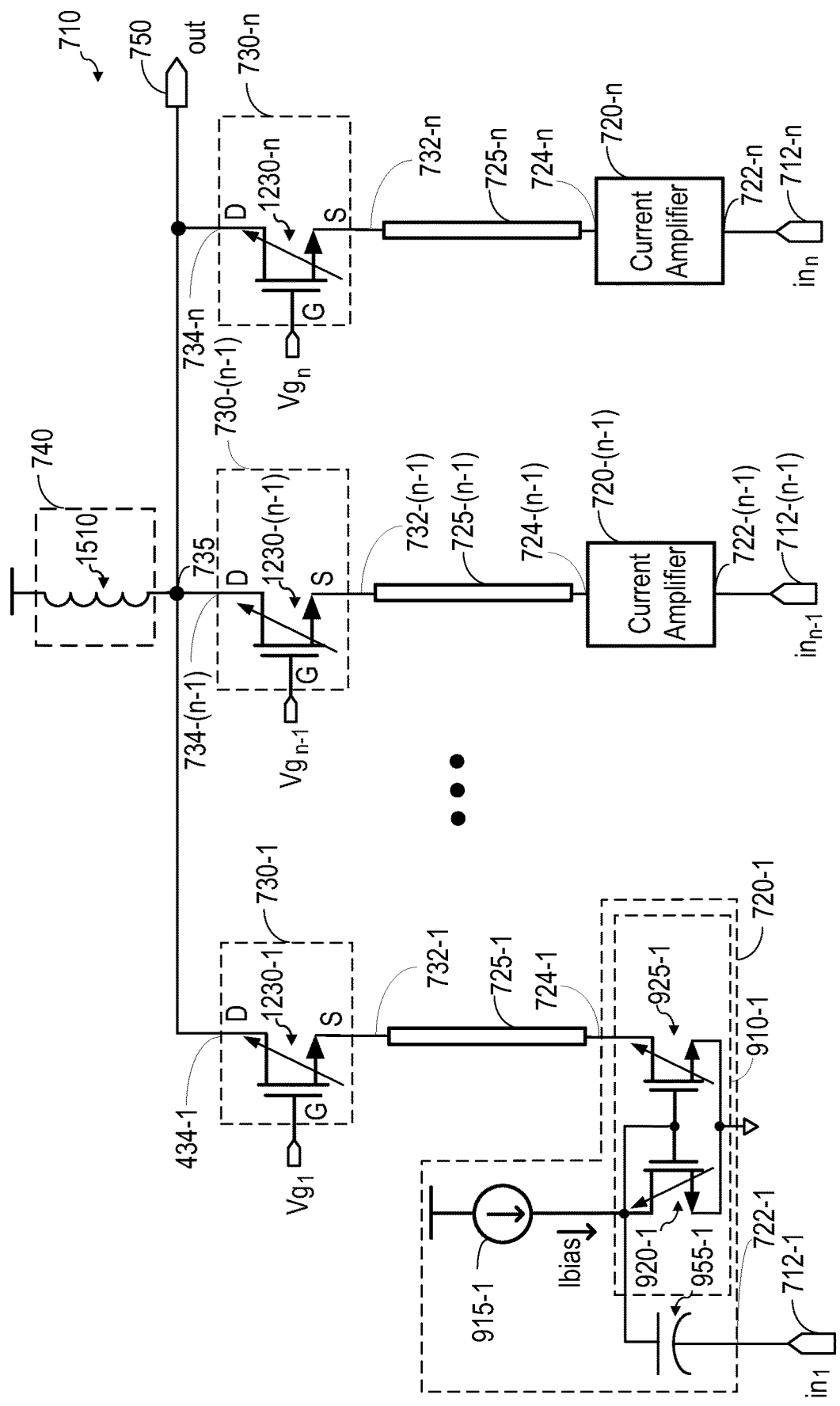
FIG. 15 shows an example of a combiner including current amplifiers and common gate amplifiers according to certain aspects of the present disclosure.

FIG. 15 shows an example of the combiner 710, in which the first amplifiers 720-1 to 720-*n* are current amplifiers and the second amplifiers 730-1 to 730-*n* are common gate amplifiers. In this example, each of the first amplifiers 720-1 to 720-*n* may be implemented with the exemplary current amplifier 905 shown in FIG. 9. For ease of illustration, FIG. 15 only shows details for one of the first amplifiers (i.e., first amplifier 720-1). The second amplifiers 730-1 to 730-*n* may be implemented with the common gate amplifiers shown in FIG. 13.

In this example, the first amplifiers 720-1 to 720-*n* have programmable current gains, in which the current gain of each of the first amplifiers 720-1 to 720-*n* may be independently set by control circuit 1150 (shown in FIG. 11). The second amplifiers 730-1 to 730-*n* have programmable input impedances. The input impedance of each of the second amplifiers 730-1 to 730-*n* may be set by the gate bias circuit 1260 (shown in FIG. 12) and/or control circuit 1360 (shown in FIG. 13), as discussed above.

In this example, each of the first amplifiers 720-1 to 720-*n* is configured to receive a respective input current (e.g., from the output of a respective one of the receiver elements 815-1 to 815-*n*), amplify the respective input current to generate a respective output current, and drive the respective transmission line 725-1 to 725-*n* with the respective output current. Each of the second amplifiers 730-1 to 730-*n* receives the output current of the respective one of the first amplifiers 720-1 to 720-*n* via the respective transmission line 725-1 to 725-*n*.

In the example in FIG. 15, each of the first amplifiers 720-1 to 720-*n* has a high output impedance. This is because impedance looking into the drain of the respective output transistor 925-1 to 925-*n* is high, as discussed above. The high output impedance of each of the first amplifiers 720-1 to 720-*n* allows each of the amplifiers 720-1 to 720-*n* to efficiently drive the respective transmission line 725-1 to 725-*n* with current. Each of the second amplifiers 730-1 to 730-*n* has a low input impedance (e.g., approximately equal to 1/gm of the respective transistor 1230-1 to 1230-*n*).

In the example in FIG. 15, each of the second amplifiers 730-1 to 730-*n* has approximately unity current gain. As a result, the output currents of the second amplifiers 730-1 to 730-*n* are approximately equal to the currents at the inputs 732-1 to 732-*n* of the second amplifiers 730-1 to 730-*n*. The output currents of the second amplifiers 730-1 to 730-*n* are combined into a combined current at the combining node 735. The load 740 converts the combined current into a voltage that provides the combined signal of the combiner 710. The second amplifiers 730-1 to 730-*n* have high output impedances, which helps isolate the combined signal from the inputs 732-1 to 732-*n* of the second amplifiers 730-1 to 730-*n*.

The output voltage swing of the combined signal depends on the impedance of the load 740. In certain aspects, the impedance of the load 740 may be chosen so that the combined signal has a desired output voltage swing. The desired output voltage swing may be high enough to provide a good signal-to-noise ratio (SNR), but not too high (which may place a large amount of strain on the outputs of the second amplifiers 730-1 to 730-*n* and/or cause non-linear distortion). FIG. 15 shows an example in which the load 740 is an inductive load including an inductor 1510. However, it is to be appreciated that the present disclosure is not limited to this example, and that the load 740 may be implemented with a choke, a bias-T network, a resonator, or another type of load.

The output voltage swing of the combined signal of the combiner 710 may be adjusted (i.e., tuned) by tuning the impedance of the load 740 (e.g., tuning the impedance of the load 740 at a center frequency of the signals being combined). The higher the impedance of the load 740, the larger the output voltage swing of the combined signal. In this example, the impedance of the load 740 may be adjusted by adjusting the inductance of an inductor in the load 740 and/or adjusting the capacitance of a capacitor in the load 740. The load 740 may be implemented with a T network, a pi network, an inductor-capacitor (LC) tank, etc.

In another example, the output voltage swing may be adjusted (i.e., tuned) by adjusting the current gains of the first amplifiers 720-1 to 720-*n*. The higher the currents gains, the higher the combined current at the combining node 735, and hence the higher the output voltage swing for a given load impedance. The output voltage swing may also be adjusted by adjusting both the impedance of the load 740 and the current gains of the first amplifiers 720-1 to 720-*n*.

As discussed above, the combiner 710 may be used as a single-band combiner, or a dual-band combiner. For the case of a single-band combiner, the combiner 710 may combine signals within a frequency band. In this example, the load 740 may be configured to resonate at a resonance frequency within the frequency band so that the load 740 has a high impedance within the frequency band. The high impedance helps provide a high output voltage swing for the combined signal within the frequency band. In this example, the center frequency of the signals being combined may be located at or close to the resonance frequency of the load 740.

For the case of a dual-band combiner 710, the combiner 710 may combine one or more signals within a first frequency band and one or more signals within a second frequency band. In this example, the load 740 may be a dual-resonant load configured to resonant at a first resonance frequency within the first frequency band and a second resonance frequency within the second frequency band. As a result, the load 740 has a high impedance within the first frequency band and a high impedance within the second frequency band. The high impedance within the first frequency band provides a high output voltage swing for the first frequency band, and the high impedance within the second frequency provides a high output voltage swing for the second frequency band.

In an alternative implementation, the load 740 may be a wideband load that is tuned to a wide frequency band to provide high impedance (and high gain) over the wide frequency band. In this example, the wide frequency band includes (i.e., covers) the first and second frequency bands discussed above.

Figure 16:
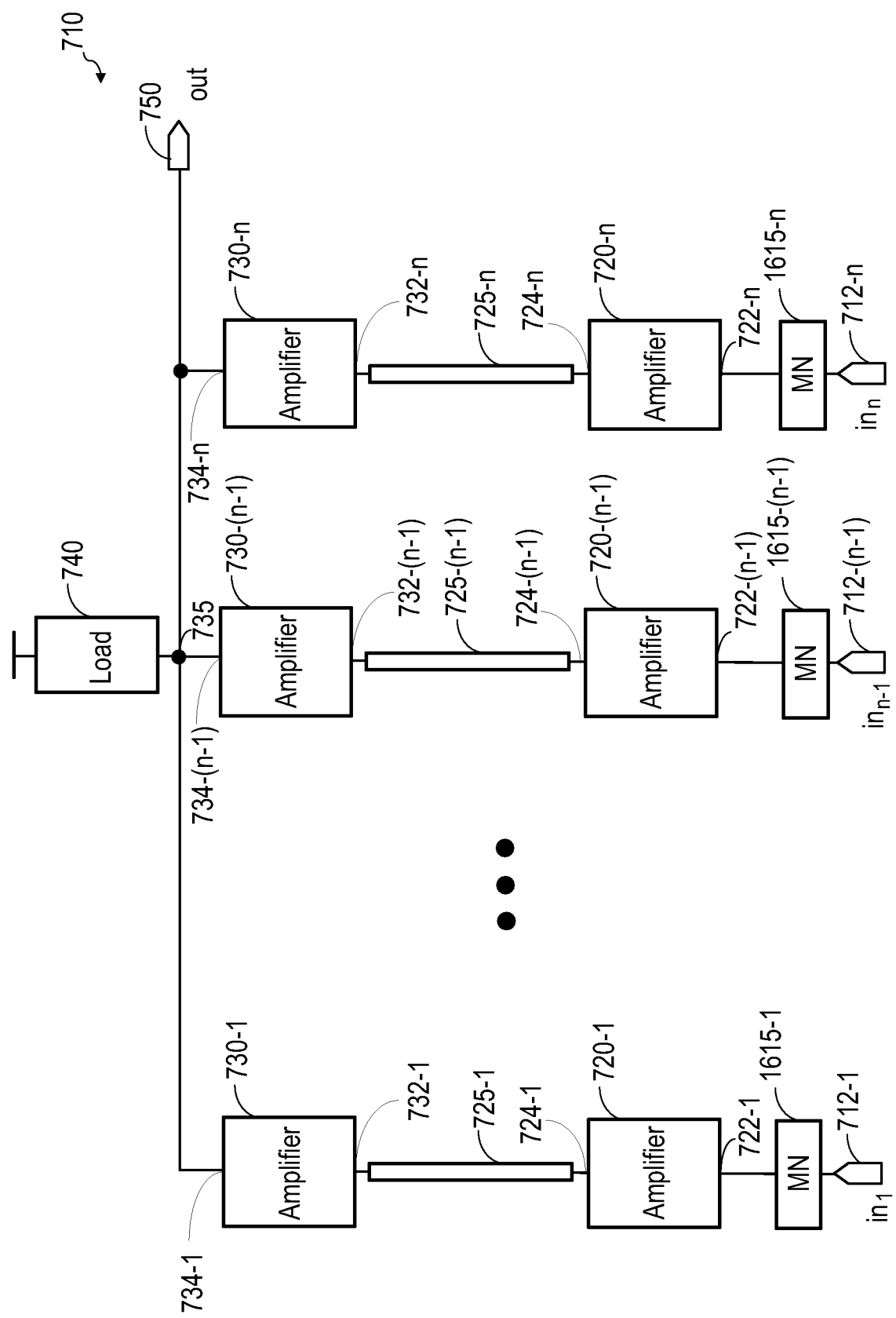
FIG. 16 shows an example of a combiner including matching networks according to certain aspects of the present disclosure.

FIG. 16 shows an example in which the combiner 710 includes multiple impedance matching networks 1615-1 to 1615-n (referred to simply as matching networks below). In this example, each of the matching networks 1615-1 to 1615-n is coupled between the input 722-1 to 722-n of a respective one of the first amplifiers 720-1 to 720-n and a respective one of the inputs 712-1 to 712-n of the combiner 710. For the example in which each of the inputs 712-1 to 712-n of the combiner 710 is coupled to the output of a respective one of the receiver elements 815-1 to 815-n, each of the matching networks 1615-1 to 1615-n is configured to provide impedance matching between the input of the respective one of the first amplifiers 720-1 to 720-n and the output of the respective one of the receiver elements 815-1 to 815-n. The impedance matching increases power transfer between the outputs of the receiver elements 815-1 to 815-n and the inputs of the first amplifiers 720-1 to 720-n.

Each of the matching networks 1615-1 to 1615-n may be implemented with an inductor, a transformer, a T network, a t network, an L network, or another type of impedance matching network. Each of matching networks 1615-1 to 1615-n may include reactive elements (e.g., inductors and/or capacitors) to reduce power loss in the matching networks 1615-1 to 1615-n.

Figure 17A:
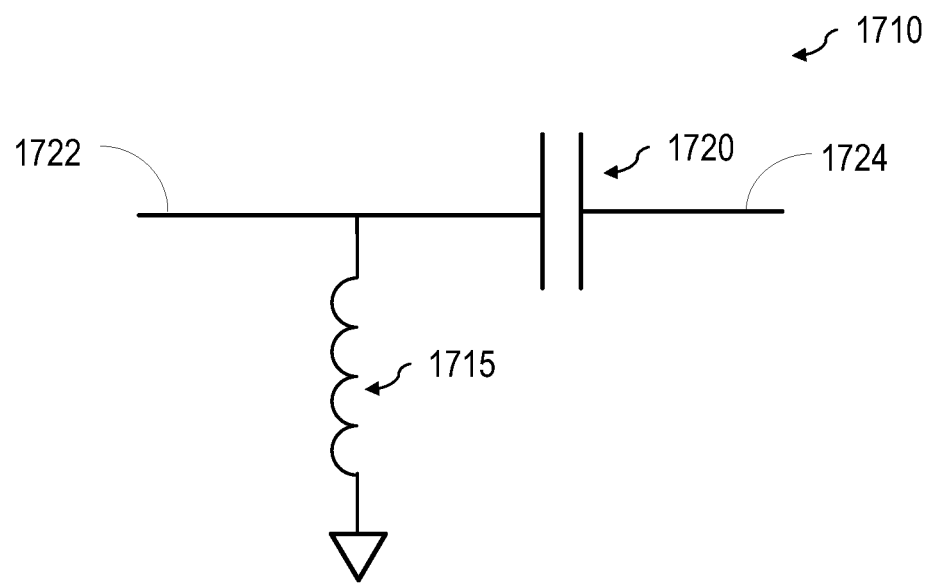
FIG. 17A shows an exemplary implementation of a matching network according to certain aspects of the present disclosure.

FIG. 17A shows an exemplary implementation of a matching network 1710. Each of the matching networks 1615-1 to 1615-n may be implemented with the exemplary matching network 1710 shown in FIG. 17A (i.e., each of the matching networks 1615-1 to 1615-n may be a separate instance of the matching networking 1710 in FIG. 17A). The matching network 1710 is an example of an L network. The matching network 1710 includes an inductor 1715 coupled between an input 1722 of the matching network 1710 and ground, and a capacitor 1720 coupled between the input 1722 and an output 1724 of the matching network 1710. The input 1722 is coupled to the respective input 712-1 to 712-n of the combiner 710, and the output 1724 is coupled to the input 722-1 to 722-n of the respective one of the first amplifiers 720-1 to 720-n. The inductance of the inductor 1715 and the capacitance of the capacitor 1720 may be selected to provide impedance matching between the input of the respective one of the first amplifiers 720-1 to 720-n and the output of the respective one of the receiver elements 815-1 to 815-n.

Figure 17B:
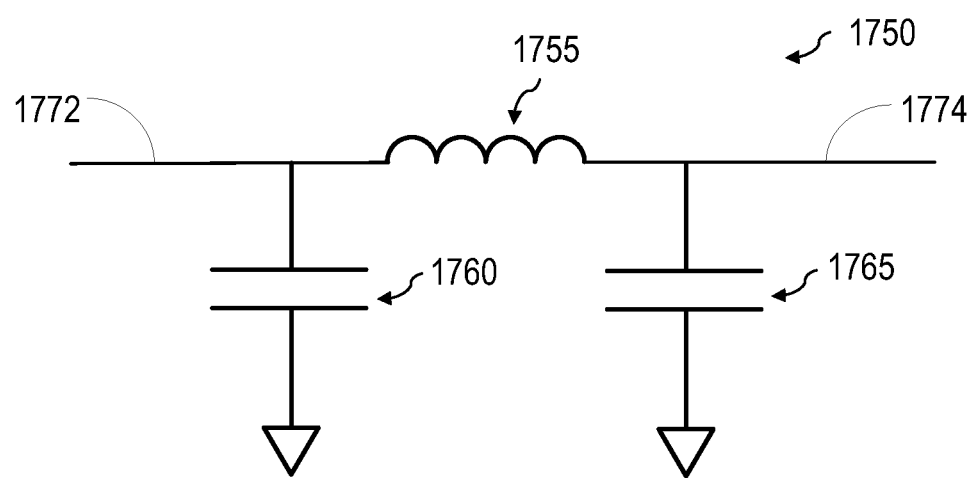
FIG. 17B shows another exemplary implementation of a matching network according to certain aspects of the present disclosure.

FIG. 17B shows another exemplary implementation of a matching network 1750. Each of the matching networks 1615-1 to 1615-n may be implemented with the exemplary matching network 1750 shown in FIG. 17B (i.e., each of the matching networks 1615-1 to 1615-n may be a separate instance of the matching networking 1750 in FIG. 17B). The matching network 1750 is an example of a t network. The matching network 1750 includes a first shunt capacitor 1760, a second shunt capacitor 1765, and an inductor 1755 coupled between the first shunt capacitor 1760 and the second shunt capacitor 1765. The first shunt capacitor 1760 is coupled between an input 1772 of the matching network 1750 and ground, the second shunt capacitor 1765 is coupled between an output 1774 of the matching network 1750 and ground, and the inductor 1755 is coupled between the input 1772 and the output 1774 of the matching network 1750. The inductance of the inductor 1755 and the capacitances of the first and second shunt capacitors 1760 and 1765 may be selected to provide impedance matching between the input of the respective one of the first amplifiers 720-1 to 720-n and the output of the respective one of the receiver elements 815-1 to 815-n.

For the example in which the combiner 710 is a dual-band combiner, one or more of the matching networks 1615-1 to 1615-n may be configured to provide impedance matching within a first frequency band to receive signals in the first frequency band (e.g., LB), and one or more other ones of the matching networks 1615-1 to 1615-n may be configured to provide impedance matching within a second frequency band to receive signals in the second frequency band (e.g., HB).

A matching network (e.g., one of the matching networks 1615-1 to 1615-n) used for the first frequency band (e.g., LB) may include one or more inductors and one or more capacitors arranged in a network. In this example, the inductance(s) of the one or more inductors (e.g., inductor 1715 or inductor 1755) and/or the capacitance(s) of the one or more capacitors (e.g., capacitor 1720 or capacitors 1760 and 1765) in the matching network may be selected such that the matching network provides impedance matching at a first frequency within the first frequency band. The first frequency may be approximately equal to a center frequency of a signal input to the respective one of the first amplifiers 720-1 to 720-n, in which the center frequency of the signal is within the first frequency band.

A matching network (e.g., one of the matching networks 1615-1 to 1615-n) used for the second frequency band (e.g., HB) may include one or more inductors and one or more capacitors arranged in a network. In this example, the inductance(s) of the one or more inductors (e.g., inductor 1715 or inductor 1755) and/or the capacitance(s) of the one or more capacitors (e.g., capacitor 1720 or capacitors 1760 and 1765) in the matching network may be selected such that the matching network provides impedance matching at a second frequency within the second frequency band. The second frequency may be approximately equal to a center frequency of a signal input to the respective one of the first amplifiers 720-1 to 720-n, in which the center frequency of the signal is within the second frequency band. The first frequency and the second frequency may be spaced at least one gigahertz apart (e.g., for the example in which the first frequency band is the LB and the second frequency band is the HB).

In the above examples, the matching network for the first frequency band and the matching network for the second frequency band may be implemented using the same type of network (e.g., network, L network, t network, etc.) or different types of networks. The inductor(s) and/or capacitor(s) in the matching network for the first frequency band may have different inductance(s) and/or capacitance(s) than the inductor(s) and/or capacitor(s) in the matching network for the second frequency band even if the same type of matching network is used for both frequency bands. This is because the matching networks are tuned to provide impedance matching for different frequencies (i.e., the first and second frequencies).

The matching networks 1615-1 to 1615-$n$ may be omitted in some implementations. For example, the matching networks 1615-1 to 1615-$n$ may be omitted for the case where the first amplifiers 720-1 to 720-$n$ are current amplifiers and the inputs 722-1 to 722-$n$ of the first amplifiers 720-1 to 720-$n$ are driven with currents by respective receiver elements 815-1 to 815-$n$. In this example, each of the receiver elements 815-1 to 815-$n$ may have a high output impedance so that the output of the receiver element approaches an ideal current source (which has infinite output impedance). This allows each of the receiver elements 815-1 to 815-$n$ to efficiently drive the input 712-1 to 712-$n$ of the respective first amplifier 720-1 to 720-$n$ with current.

Figure 18:
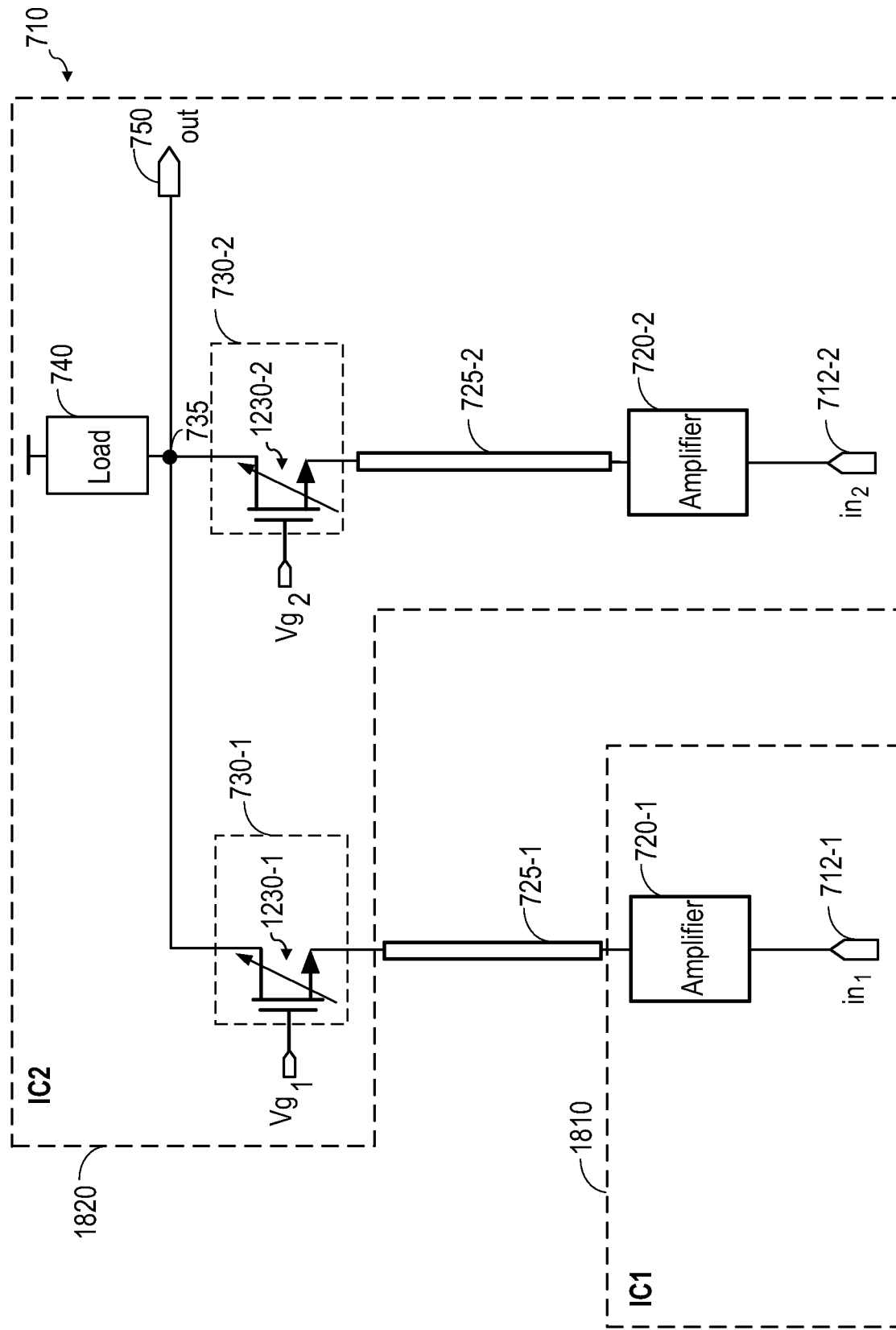
FIG. 18 shows an example of an inter-chip combiner according to certain aspects of the present disclosure.

In certain aspects, the combiner 710 may be used for inter-chip signal combining, in which the combiner 710 combines signals from two or more chips (i.e., dies). In this regard, FIG. 18 shows an example in which the combiner 710 combines signals from a first chip 1810 (labeled "IC1") and a second chip 1820 (labeled ("IC2"). The first chip 1810 and the second chip 1820 may be mounted on a common substrate (e.g., a printed circuit board (PCB)). In the example shown in FIG. 18, a first one of the first amplifiers 720-1 is integrated on the first chip 1810, and a second one of the first amplifiers 720-2 is integrated on the second chip 1820. Also, the second amplifiers 730-1 to 730-2 and the load 740 are integrated on the second chip 1820.

In this example, the first one of the first amplifiers 720-1 may receive a signal from a receiver element (e.g., respective one of the receiver elements 815-1 to 815-$n$) or a previous combining stage (e.g., respective one of the first and second combiners 635 and 665), which may or may not be integrated on the first chip 1810. Also, the second one of the first amplifiers 720-2 may receive a signal from a receiver element (e.g., respective one of the receiver elements 815-1 to 815-$n$) or a previous combining stage (e.g., respective one of the first and second combiners 635 and 665), which may or may not be integrated on the second chip 1820.

In this example, at least a portion of the transmission line 725-1 coupling the first one of the first amplifiers 720-1 to the respective second amplifier 730-1 is external to the first chip 1810 and the second chip 1820. The external portion of the transmission line 725-1 may include a cable, a waveguide, or another type of transmission line capable of carrying an RF or IF signal. For the example in which the first chip 1810 and the second chip 1820 are mounted on a common substrate (e.g., PCB), the external portion of the transmission line 725-1 may be formed on the substrate (e.g., include one or more metal traces on the substrate). Note that FIG. 18 depicts the entire transmission line 725-1 as being external to the first and second chips 1810 and 1820 for ease of illustration. However, it is to be appreciated that the transmission line 725-1 may include a first portion (e.g., metal line) on the first chip 1810 and a second portion (e.g., metal line) on the second chip 1820. The transmission line 725-2 coupling the second one of the first amplifiers 720-2 to the respective second amplifier 730-2 may be integrated on the second chip 1820, as shown in FIG. 18.

The combined signal at the output 750 of the combiner 710 may be output to receive circuitry (not shown) for further processing (e.g., frequency down-conversion, filtering, demodulation, analog-to-digital conversion, baseband processing, etc.) or output to another combiner (not shown) in a subsequent combining stage to be combined with other signals (e.g., from other chips).

In the example shown in FIG. 18, the combiner 710 may be a single-band combiner or a dual-band combiner. For the dual-band example, the signal input to the first one of the first amplifiers 720-1 is in a first frequency band (e.g., LB) and the signal input to the second one of the first amplifiers 720-2 is in a second frequency band (e.g., HB). In this example, the load 740 may be a dual-resonant load or a wideband load, as discussed above.

Although FIG. 18 shows an example in which the combiner 710 combines signals from two chips (i.e., the first chip 1810 and the second chip 1820), it is to be appreciated that the combiner 710 may combine signals from more than two chips.

In certain aspects, multiple combiners may be coupled together to form a large combiner configured to combine signals from a large number of antennas (e.g., 64 or 128 antennas) in a phased antenna array (e.g., phased antenna array 205). An advantage of combining signals from a large number of antennas in the phased antenna array is that a large number of antennas allows the receive beam pattern to be very narrow (i.e., focused) for high receive directivity. In these aspects, each of the multiple combiners in the large combiner may be implemented with the combiner 710 (e.g., each of the multiple combiners may be a separate instance of the combiner 710). The multiple combiners may be coupled in a tree configuration, a chain configuration, or another configuration to form the large combiner.

In one example, the number of receiver elements that can be coupled to a single combiner (e.g., combiner 710) may be limited (e.g., due to parasitics and/or another limitation). In this example, coupling multiple combiners together to form a large combiner overcomes the limited number of receiver elements that can be coupled to a single combiner, allowing signals from a much larger number of receiver elements to be combined.

Figure 19:
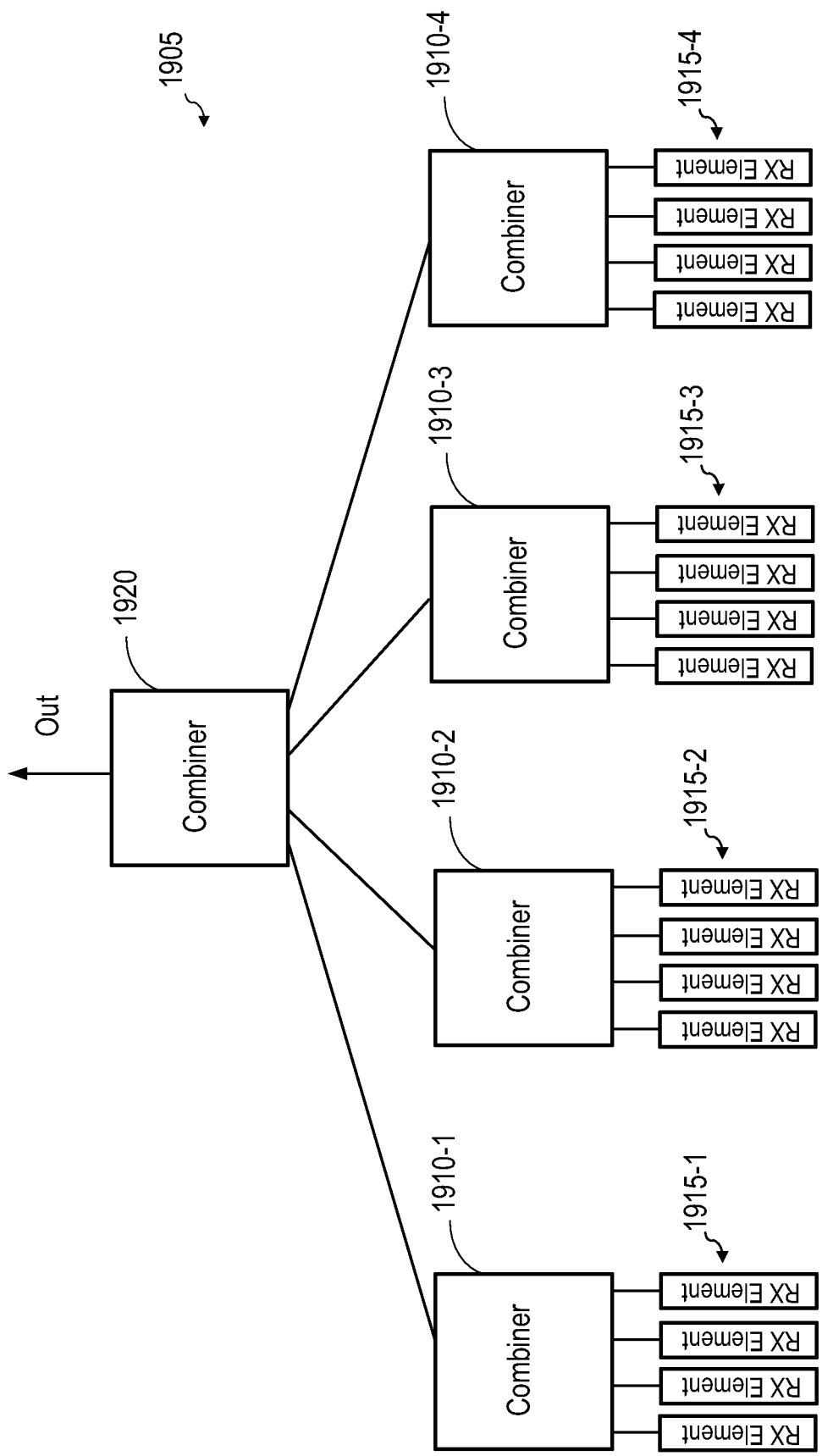
FIG. 19 shows an example of multiple combiners coupled in a tree configuration according to certain aspects of the present disclosure.

FIG. 19 shows an example of multiple combiners 1910-1 to 1910-4 and 1920 coupled together in a tree configuration to form a large combiner 1905. Each of the combiners 1910-1 to 1910-4 and 1920 may be implemented with the combiner 710 shown in FIG. 7, 8, 11, 12, 13, 15 or 16 (e.g., each of the combiners 1910-1 to 1910-4 and 1920 may be a separate instance of the combiner 710). In the example shown in FIG. 19, each of the combiners 1910-1 to 1910-4 and 1920 is a 4-to-1 combiner, although it is to be appreciated that the present disclosure is not limited to this example. The inputs of each of the combiners 1910-1 to 1910-4 are coupled to a respective set of four receiver elements 1915-1 to 1915-4. Each receiver element may receive a signal from a respective antenna (e.g., respective one of the antennas 210-1 to 210-$k$) in the phased antenna array. The inputs of combiner 1920 are coupled to the outputs of combiners 1910-1 to 1910-4. The output of combiner 1920 provides the output (labeled "Out") of the large combiner 1905.

In operation, each of the combiners 1910-1 to 1910-4 combines signals from the respective set of four receiver elements 1915-1 to 1915-4 into a respective combined signal, and outputs the respective combined signal to combiner 1920. Combiner 1920 combines the combined signals from the combiners 1910-1 to 1910-4 into a single combined signal, and outputs the single combined signal at the output of the large combiner 1905. The single combined signal may be output to receive circuitry (not shown) for further processing (e.g., frequency down-conversion, filtering, analog-to-digital conversion, demodulation, baseband processing, etc.) or output to another combiner (not shown) in a subsequent combining stage to be combined with other signals.

The combiners 1910-1 to 1910-4 and 1920 may be formed on multiple chips, in which the combiners 1910-1 to 1910-4 and 1920 include external transmission lines coupled between the chips. Although FIG. 19 shows an example in which multiple 4-to-1 combiners are combined to form a 16-to-1 combiner, it is to be appreciated that the present disclosure is not limited to this example. For example, a larger number of combiners may be coupled together in a tree configuration to form a larger combiner (e.g., a 64-to-1 combiner or a 128-to-1 combiner).

In one example, the first amplifiers 720-1 to 720-*n* of the combiner 1920 may be current amplifiers. If the output of each of the combiners 1910-1 to 1910-4 is a voltage in this example, then the output of each of the combiners 1910-1 to 1940-4 may be coupled to the respective input of the combiner 1920 via a transconductance amplifier (not shown) configured to convert the respective voltage into a respective current.

Figure 20:
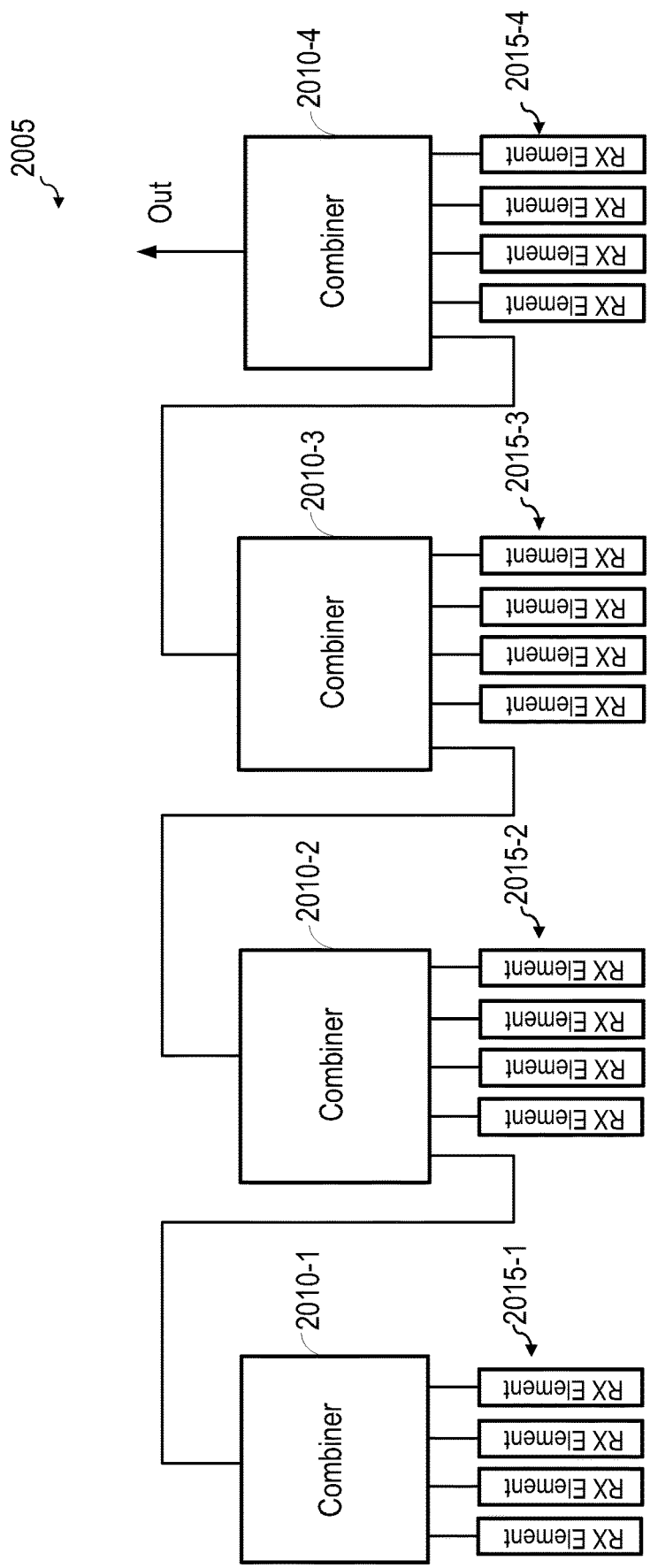
FIG. 20 shows an example of multiple combiners coupled in a chain configuration according to certain aspects of the present disclosure.

FIG. 20 shows an example of multiple combiners 2010-1 to 2010-4 coupled together in a chain configuration to form a large combiner 2005. Each of the combiners 2010-1 to 2010-4 may be implemented with the combiner 710 shown in FIG. 7, 8, 11, 12, 13, 15 or 16 (e.g., each of the combiners 2010-1 to 2010-4 may be a separate instance of the combiner 710). The inputs of the first combiner 2010-1 in the chain are coupled to a respective set of receiver elements 2015-1. The inputs of the second combiner 2010-2 in the chain are coupled to a respective set of receiver elements 2015-2 and the output of the first combiner 2010-1. The inputs of the third combiner 2010-3 in the chain are coupled to a respective set of receiver elements 2015-3 and the output of the second combiner 2010-2. The inputs of the fourth combiner 2010-4 in the chain are coupled to a respective set of receiver elements 2015-4 and the output of the third combiner 2010-3. The output of the fourth combiner 2010-4 provides the output (labeled "Out") of the large combiner 2005. Each receiver element may receive a signal from a respective antenna (e.g., respective one of the antennas 210-1 to 210-*k*) in the phased antenna array.

In operation, the first combiner 2010-1 combines signals from the respective set of receiver elements 2015-1 into a respective combined signal, and outputs the respective combined signal to the second combiner 2010-2. The second combiner 2010-2 combines signals from the respective set of receiver elements 2015-2 and the combined signal from the first combiner 2010-1 into a respective combined signal, and outputs the respective combined signal to the third combiner 2010-3. The third combiner 2010-3 combines signals from the respective set of receiver elements 2015-3 and the combined signal from the second combiner 2010-2 into a respective combined signal, and outputs the respective combined signal to the fourth combiner 2010-4. The fourth combiner 2010-4 combines signals from the respective set of receiver elements 2015-4 and the combined signal from the third combiner 2010-3 into a respective combined signal, and outputs the respective combined signal as the combined signal of the large combiner 2005. The combined signal may be output to receive circuitry (not shown) for further processing (e.g., frequency down-conversion, filtering, analog-to-digital conversion, demodulation, baseband processing, etc.) or output to another combiner (not shown) in a subsequent combining stage to be combined with other signals.

The combiners 2010-1 to 2010-4 may be formed on multiple chips, in which the combiners 2010-1 to 2010-4 include external transmission lines coupled between the chips.

It is to be appreciated that the present disclosure is not limited to the exemplary configurations illustrated in FIGS. 19 and 20. For example, multiple combiners may be coupled in a hybrid configuration in which the combiners are divided into groups. In this example, combiners within a group may be coupled in a chain configuration while the groups of combiners may be coupled in a tree configuration or vice versa.

Figure 21:
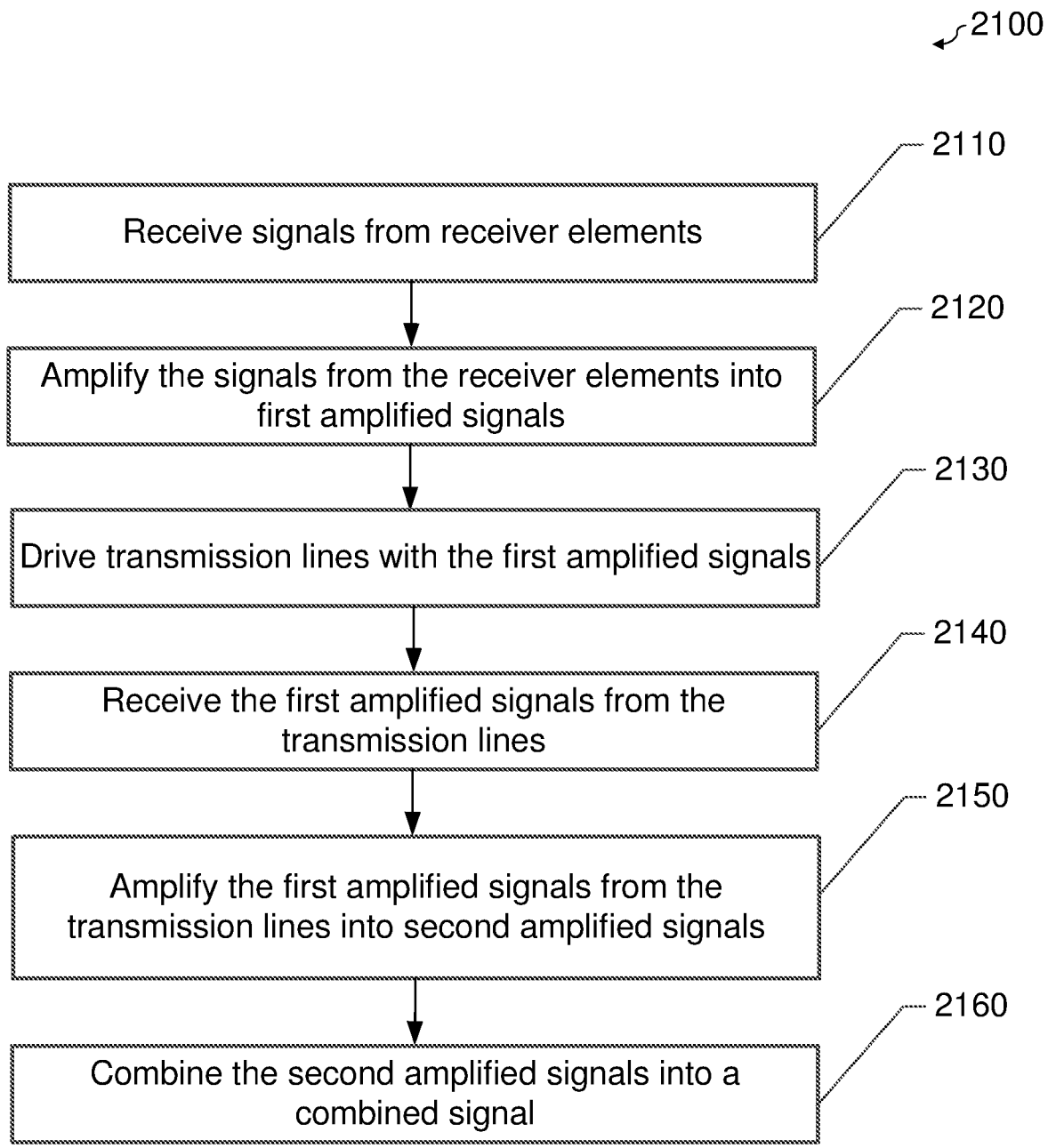
FIG. 21 is a flowchart illustrating a method for signal combining according to certain aspects of the present disclosure.

FIG. 21 illustrates a method 2100 for signal combining according to certain aspects of the present disclosure.

At block 2110, signals are received from receiver elements. The receiver elements may correspond to receiver elements 315-1 to 315-*n*, 415-1 to 415-*n*, 515-1 to 515-*n*, 615-1 to 615-*n*, or 645-1 to 645-*m*.

At block 2120, the signals from the receiver elements are amplified into first amplified signals. The signals from the receiver elements may be amplified using current amplifiers (e.g., current amplifiers 720-1 to 720-*n* in FIG. 11), or transconductance amplifiers. In certain aspects, a first one of the signals from the receiver elements is amplified by a first gain and a second one of the signals from the receiver elements is amplified by a second gain, in which the first gain and the second gain are different.

At block 2130, the transmission lines are driven with the first amplified signals. The transmission lines may correspond to transmission lines 725-1 to 725-*n*.

At block 2140, the first amplified signals are received from the transmission lines. In certain aspects, the transmission lines are driven with the first amplified signals at first ends of the transmission lines, and the first amplified signals are received at second ends of the transmission lines.

At block 2150, the first amplified signals from the transmission lines are amplified into second amplified signals. The first amplified signals from the transmission lines may be amplified using common gate amplifiers (e.g., common gate amplifiers 734-1 to 734-*n* in FIG. 12). In one example, each of first and second ones of the common gate amplifiers have adjustable channel widths. In this example, the channel width of the first one of the common gate amplifiers may be set to a first channel width, and the channel width of the second one of the common gate amplifiers may be set to a second channel width, in which the first channel width is different from the second channel width. In one example, a gate of a first one of the common gate amplifiers may be biased with a first gate bias voltage, and a gate of a second one of the common gate amplifiers may be biased with a second gate bias voltage, in which the first gate bias voltage is different from the second gate bias voltage.

At block 2160, the second amplified signals are combined into a combined signal. For the example in which the first amplified signals are amplified into the second amplified signals using common gate amplifiers, the second amplified signals may be combined at a combining node (e.g., combining node 735) coupled to the outputs of the common gate amplifiers.

As used herein, the term "receiver" may refer to an apparatus that processes one or more signals received from one or more antennas (e.g., in a phased antenna array). The "receiver" is not required to process the one or more signals all the way to a baseband signal. For example, the "receiver" may process the one or more signals into an intermediate signal (e.g., combined signal) that is further processed by subsequent receive circuitry into a baseband signal.

As used herein, the term "electronically adjustable" means adjustable by an electrical signal such as a voltage or current.

It is to be appreciated that any of the transmission lines discussed above may include one or more metal traces on a chip (die), one or more metal traces on a printed circuit board, one or more cables (e.g., one or more coaxial cables), a waveguide, or any combination thereof.

It is to be appreciated that the present disclosure is not limited to the exemplary terminology used above to describe aspects of the present disclosure. For example, the term "signal combining" may also be referred to as "power combining." In another example, the term "impedance matching" may also be referred to as "power matching." In another example, the term "receiver element" may also be referred to as a "receiver chain." For the example in which a "receiver element" outputs an RF signal, the "receiver element" may also be referred to as an "RF chain."

The phase-shift controllers 355, 455, 555 and 680, the control circuit 1070, the control circuit 1150, the gate bias circuit 1260 and the control circuit 1360 discussed above may each be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A receiver, comprising:
   first amplifiers, wherein each one of the first amplifiers comprises an input and an output;
   second amplifiers, wherein each one of the second amplifiers comprises an input and an output, and the outputs of the second amplifiers are coupled to a combining node;
   transmission lines, wherein each one of the transmission lines is coupled between the output of a respective one of the first amplifiers and the input of a respective one of the second amplifiers;
   a load coupled to the combining node;
   receiver elements, wherein each one of the receiver elements comprises an input and an output, and the output of each one of the receiver elements is coupled to the input of a respective one of the first amplifiers;
   antennas, wherein the input of each one of the receiver elements is coupled to a respective one of the antennas, and
   a local oscillator configured to generate a local oscillator signal, wherein each one of the receiver elements comprises a mixer configured to mix a signal received at the mixer with the local oscillator signal or a signal based on the local oscillator signal.

2. The receiver of claim 1, wherein each one of the receiver elements comprises a phase shifter configured to:
   receive a signal from the respective one of the antennas; and
   shift a phase of the signal from the respective one of the antennas by a respective phase shift to generate a phase-shifted signal.

3. The receiver of claim 2, further comprising a phase-shift controller, wherein the antennas are part of a phased antenna array, and, for each one of the receiver elements, the phase-shift controller is configured to set the respective phase shift based on a receive direction for the phased antenna array.

4. The receiver of claim 2,
   wherein each mixer is configured to:
   receive the phase-shifted signal from the respective phase shifter; and
   mix the phase-shifted signal from the respective phase shifter with the local oscillator signal.

5. The receiver of claim 1,
   wherein each one of the receiver elements comprises:
   a phase shifter configured to receive the local oscillator signal and shift a phase of the local oscillator signal by a respective phase shift to generate a respective phase-shifted local oscillator signal; and
   wherein each mixer is configured to:
   receive a signal from the respective one of the antennas; and
   mix the signal from the respective one of the antennas with the respective phase-shifted local oscillator signal.

6. The receiver of claim 1, wherein each one of the second amplifiers is a common gate amplifier.

7. The receiver of claim 6, wherein each one of the second amplifiers has an electronically adjustable channel width.

8. The receiver of claim 7, wherein:
   each one of the second amplifiers comprises:
   multiple branches coupled between the combining node and the respective one of the transmission lines, wherein each one of the multiple branches comprises a transistor and a switch coupled in series, and each one of the multiple branches is enabled by closing the respective switch; and
   the receiver further comprises a control circuit configured to set the channel width of each one of the second amplifiers by controlling a number of the respective branches that are enabled.

9. The receiver of claim 7, wherein:
   each one of the second amplifiers comprises:
   multiple branches coupled between the combining node and the respective one of the transmission lines, wherein each one of the multiple branches comprises a transistor and a switch configured to selectively couple a gate of the transistor to a gate bias voltage or a ground, and each one of the multiple branches is enabled by setting the respective switch to couple the gate of the respective transistor to the gate bias voltage; and the receiver further comprises a control circuit configured to set the channel width of each one of the second amplifiers by controlling a number of the respective branches that are enabled.

10. The receiver of claim 9, wherein the switch in each one of the multiple branches comprises a respective single-pole-two-throw switch.

11. The receiver of claim 7, further comprising:
a register configured to store, for each one of the second amplifiers, a respective channel width value; and
a control circuit configured to set the channel width of each one of the second amplifiers based on the respective channel width value in the register.

12. The receiver of claim 11, wherein the channel width value for a first one of the second amplifiers is different from the channel width value for a second one of the second amplifiers.

13. The receiver of claim 1, wherein each one of the first amplifiers is a current amplifier.

14. The receiver of claim 13, wherein each one of the first amplifiers comprises:
a current source;
a current mirror comprising an input and an output, wherein the input of the current mirror is coupled to the current source and the input of the first amplifier, and the output of the current mirror is coupled to the respective one of the transmission lines.

15. The receiver of claim 14, wherein the current mirror of each one of the first amplifiers has an electronically adjustable current-mirror ratio.

16. The receiver of claim 15, further comprising:
a register configured to store, for each one of the first amplifiers, a respective current gain value; and
a control circuit configured to set the current-mirror ratio of the current mirror of each one of the first amplifiers based on the respective current gain value in the register.

17. The receiver of claim 16, wherein the current gain value for a first one of the first amplifiers is different from the current gain value for a second one of the first amplifiers.

18. The receiver of claim 14, wherein the current mirror of each one of the first amplifiers comprises:
an input transistor comprising a drain coupled to the input of the current mirror, a gate coupled to the input of the current mirror, and a source coupled to a ground; and
an output transistor comprises a drain coupled to the output of the current mirror, a gate coupled to the gate of the input transistor, and a source coupled to the ground.

19. The receiver of claim 18, wherein, for each one of the first amplifiers, the input transistor of the respective current mirror has an electronically adjustable channel width.

20. The receiver of claim 18, wherein, for each one of the first amplifiers, the output transistor of the respective current mirror has an electronically adjustable channel width.

21. The receiver of claim 1, wherein a first one of the transmission lines has a length that is at least 20 percent longer than a length of a second one of the transmission lines.

22. A receiver, comprising:
first amplifiers, wherein each one of the first amplifiers comprises an input and an output;
second amplifiers, wherein each one of the second amplifiers comprises an input and an output, and the outputs of the second amplifiers are coupled to a combining node;
transmission lines, wherein each one of the transmission lines is coupled between the output of a respective one of the first amplifiers and the input of a respective one of the second amplifiers;
a load coupled to the combining node; and
receiver elements, wherein each one of the receiver elements comprises an input and an output, and the output of each one of the receiver elements is coupled to the input of a respective one of the first amplifiers,
wherein each one of the second amplifiers is a common gate amplifier, and wherein each one of the second amplifiers comprises a transistor comprising a drain coupled to the combining node, a gate, and a source coupled to the respective one of the transmission lines.

23. The receiver of claim 22, further comprising a gate bias circuit, wherein, for each one of the second amplifiers, the gate bias circuit is configured to bias the gate of the respective transistor.

24. The receiver of claim 23, wherein the gate bias circuit is configured to:
bias the gate of the transistor of a first one of the second amplifiers at a first gate bias voltage; and
bias the gate of the transistor of a second one of the second amplifiers at a second gate bias voltage, wherein the first gate bias voltage and the second gate bias voltage are different.

25. The receiver of claim 23, further comprising:
a register configured to store, for each one of the second amplifiers, a respective gate bias voltage value;
wherein, for each one of the second amplifiers, the gate bias circuit is configured to bias the gate of the respective transistor based on the respective gate bias voltage value in the register.

26. The receiver of claim 25, wherein the gate bias voltage value for a first one of the second amplifiers is different from the gate bias voltage value for a second one of the second amplifiers.

27. A receiver, comprising:
first amplifiers, wherein each one of the first amplifiers comprises an input and an output;
second amplifiers, wherein each one of the second amplifiers comprises an input and an output, and the outputs of the second amplifiers are coupled to a combining node;
transmission lines, wherein each one of the transmission lines is coupled between the output of a respective one of the first amplifiers and the input of a respective one of the second amplifiers;
a load coupled to the combining node; and
receiver elements, wherein each one of the receiver elements comprises an input and an output, and the output of each one of the receiver elements is coupled to the input of a respective one of the first amplifiers,
wherein the load comprises at least one of an inductor, a choke, or a resonator.

28. The receiver of claim 27, wherein a first one of the transmission lines has a length that is at least 20 percent longer than a length of a second one of the transmission lines.

29. The receiver of claim 27, wherein each one of the second amplifiers has an electronically adjustable channel width.

30. A receiver, comprising:
first amplifiers, wherein each one of the first amplifiers comprises an input and an output;
second amplifiers, wherein each one of the second amplifiers comprises an input and an output, and the outputs of the second amplifiers are coupled to a combining node;
transmission lines, wherein each one of the transmission lines is coupled between the output of a respective one of the first amplifiers and the input of a respective one of the second amplifiers;
a load coupled to the combining node; and
receiver elements, wherein each one of the receiver elements comprises an input and an output, and the output of each one of the receiver elements is coupled to the input of a respective one of the first amplifiers,
wherein:
a first one of the first amplifiers is integrated on a first chip;
a second one of the first amplifiers is integrated on a second chip;
first and second ones of the second amplifiers are integrated on the second chip; and
a first one of the transmission lines is coupled between the output of the first one of the first amplifiers and the input of the first one of the second amplifiers, wherein at least a portion of the first one of the transmission lines is external to both the first and second chips.

31. The receiver of claim 30, wherein a second one of the transmission lines is integrated on the second chip, and the second one of the transmission lines is coupled between the output of the second one of the first amplifiers and the input of the second one of the second amplifiers.

32. The receiver of claim 30, wherein:
the first and second chips are mounted on a substrate; and
the at least the portion of the first one of the transmission lines is formed on the substrate.

33. A receiver, comprising:
first amplifiers, wherein each one of the first amplifiers comprises an input and an output;
second amplifiers, wherein each one of the second amplifiers comprises an input and an output, and the outputs of the second amplifiers are coupled to a combining node;
transmission lines, wherein each one of the transmission lines is coupled between the output of a respective one of the first amplifiers and the input of a respective one of the second amplifiers;
a load coupled to the combining node;
receiver elements, wherein each one of the receiver elements comprises an input and an output, and the output of each one of the receiver elements is coupled to the input of a respective one of the first amplifiers;
a first matching network coupled between the input of a first one of the first amplifiers and the output of a first one of the receiver elements; and
a second matching network coupled between the input of a second one of the first amplifiers and the output of a second one of the receiver elements;
wherein the first matching network is configured to provide impedance matching between the input of the first one of the first amplifiers and the output of the first one of the receiver elements at a first frequency, and the second matching network is configured to provide impedance matching between the input of the second one of the first amplifiers and the output of the second one of the receiver element at a second frequency.

34. The receiver of claim 33, wherein the load is tuned to a wide frequency band, the wide frequency band including the first frequency and the second frequency.

35. The receiver of claim 33, wherein the load comprises a dual-resonant load.

36. The combiner of claim 33, wherein the first frequency and the second frequency are spaced at least one gigahertz apart.

37. A method for signal combining, comprising:
receiving signals from receiver elements;
amplifying the signals from the receiver elements into first amplified signals;
driving transmission lines with the first amplified signals;
receiving the first amplified signals from the transmission lines;
amplifying the first amplified signals from the transmission lines into second amplified signals; and
combining the second amplified signals into a combined signal,
wherein the second amplified signals comprise currents, and combining the second amplified signals comprises combining the currents into a combined current and conducting the combined current through a load to generate the combined signal.

38. The method of claim 37, wherein amplifying the signals from the receiver elements comprises:
amplifying a first one of the signals from the receiver elements by a first gain into a first one of the first amplified signals; and
amplifying a second one of the signals from the receiver elements by a second gain into a second one of the first amplified signals;
wherein the first gain and the second gain are different.

39. The method of claim 38, wherein driving the transmission lines comprises:
driving a first one of the transmission lines with the first one of the first amplified signals; and
driving a second one of the transmission lines with the second one of the first amplified signals;
wherein the first one of the transmission lines has a length that is at least 20 percent longer than a length of the second one of the transmission lines.

40. The method of claim 38, wherein:
amplifying the first one of the signals from the receiver elements comprises amplifying the first one of the signals from the receiver elements on a first chip;
combining the second amplified signals comprises combining the second amplified signals on a second chip;
driving the transmission lines comprises driving a first one of the transmission lines with the first one of the first amplified signals; and
at least a portion of the first one of the transmission lines is external to both the first and second chips.

41. The method of claim 40, wherein:
driving the transmission lines comprises driving a second one of the transmission lines with the second one of the first amplified signals; and
the second one of the transmission lines is integrated on the second chip.

42. The method of claim 37, wherein the load comprises at least one of an inductor, a choke, or a resonator.

43. The method of claim 37, wherein:
a first one of the signals from the receiver elements has a first frequency;
a second one of the signals from the receiver elements has a second frequency; and the load comprises a wide-band load tuned to a wide frequency band including the first frequency and the second frequency, or the load comprises a dual-resonant load.

44. The method of claim 43, wherein the first frequency and the second frequency are spaced at least one gigahertz apart.

45. A method for signal combining, comprising:
receiving signals from receiver elements;
amplifying the signals from the receiver elements into first amplified signals;
driving transmission lines with the first amplified signals;
receiving the first amplified signals from the transmission lines;
amplifying the first amplified signals from the transmission lines into second amplified signals; and
combining the second amplified signals into a combined signal,
wherein:
the first amplified signals comprise currents; and
driving the transmission lines with the first amplified signals comprises conducting each one of the currents through a respective one of the transmission lines.

46. The method of claim 45, wherein amplifying the signals from the receiver elements comprises:
amplifying a first one of the signals from the receiver elements by a first gain into a first one of the first amplified signals; and
amplifying a second one of the signals from the receiver elements by a second gain into a second one of the first amplified signals;
wherein the first gain and the second gain are different.

47. A method for signal combining, comprising:
receiving signals from receiver elements;
amplifying the signals from the receiver elements into first amplified signals;
driving transmission lines with the first amplified signals;
receiving the first amplified signals from the transmission lines;
amplifying the first amplified signals from the transmission lines into second amplified signals; and
combining the second amplified signals into a combined signal,
wherein amplifying the first amplified signals from the transmission lines comprises amplifying the first amplified signals from the transmission lines using common gate amplifiers.

48. The method of claim 47, wherein:
each of first and second ones of the common gate amplifiers has an adjustable channel width;
the method further comprises setting the channel width of the first one of the common gate amplifiers to a first channel width and setting the channel width of the second one of the common gate amplifiers to a second channel width; and
the first channel width is different from the second channel width.

49. The method of claim 47, wherein:
the method further comprises biasing a gate of a first one of the common gate amplifiers with a first gate bias voltage and biasing a gate of the second one of the common gate amplifiers with a second gate bias voltage; and
the gate bias voltage is different from the second gate bias voltage.

* * * * *